(12) United States Patent
Grivna et al.

(10) Patent No.: US 8,106,436 B2
(45) Date of Patent: Jan. 31, 2012

(54) SEMICONDUCTOR TRENCH STRUCTURE HAVING A SEALING PLUG

(75) Inventors: Gordon M. Grivna, Mesa, AZ (US); Gary H. Loechelt, Tempe, AZ (US); John Michael Parsey, Jr., Phoenix, AZ (US); Mohammed Tanvir Quddus, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/005,947

(22) Filed: Jan. 13, 2011

(65) Prior Publication Data
US 2011/0233635 A1    Sep. 29, 2011

Related U.S. Application Data

(62) Division of application No. 12/206,541, filed on Sep. 8, 2008, now Pat. No. 7,902,075.

(51) Int. Cl.
*H01L 27/108* (2006.01)
*H01L 29/94* (2006.01)

(52) U.S. Cl. ............ 257/301; 257/505; 257/E29.151; 438/702

(58) Field of Classification Search ........... 257/E29.151, 257/505, 301; 438/702
See application file for complete search history.

(56) References Cited

U.S. PATENT DOCUMENTS

| | | |
|---|---|---|
| 4,899,199 A | 2/1990 | Gould |
| 5,216,275 A | 6/1993 | Chen |
| 5,418,185 A | 5/1995 | Todd et al. |
| 5,438,215 A | 8/1995 | Tihanyi |
| 5,571,738 A | 11/1996 | Krivokapic |
| 5,604,159 A | 2/1997 | Cooper et al. ............ 438/281 |
| 5,859,465 A | 1/1999 | Spring et al. |
| 5,872,421 A | 2/1999 | Potter |
| 5,886,383 A | 3/1999 | Kinzer |
| 5,990,011 A | 11/1999 | McTeer ............ 438/692 |
| 5,998,288 A | 12/1999 | Gardner et al. ............ 438/589 |
| 6,078,090 A | 6/2000 | Williams et al. |
| 6,184,555 B1 | 2/2001 | Tihanyi et al. |
| 6,191,446 B1 | 2/2001 | Gardner et al. |
| 6,210,999 B1 | 4/2001 | Gardner et al. |
| 6,255,152 B1 | 7/2001 | Chen |
| 6,274,904 B1 | 8/2001 | Tihanyi |
| 6,278,165 B1 | 8/2001 | Oowaki et al. |

(Continued)

FOREIGN PATENT DOCUMENTS
WO    WO02/19433 A2    3/2002

(Continued)

OTHER PUBLICATIONS

Semiconductor Components Industries, LLC, "NUF6106FCT1, 6 Channel EMI Pi-Filter Array with ESD Protection", Data Sheet, Mar. 2004—Rev. 0, Publication Order No: NUF6106FC/D.

(Continued)

*Primary Examiner* — Jarrett Stark
*Assistant Examiner* — Nicholas Tobergte
(74) *Attorney, Agent, or Firm* — Kevin B. Jackson

(57) ABSTRACT

In one embodiment, a semiconductor device is formed having a trench structure. The trench structure includes a single crystalline semiconductor plug formed along exposed upper surfaces of the trench. In one embodiment, the single crystalline semiconductor plug seals the trench to form a sealed core.

20 Claims, 16 Drawing Sheets

U.S. PATENT DOCUMENTS

| | | | |
|---|---|---|---|
| 6,291,333 B1 | 9/2001 | Lou | 438/618 |
| 6,355,955 B1 | 3/2002 | Gardner et al. | |
| 6,410,955 B1 | 6/2002 | Baker et al. | |
| 6,429,121 B1 | 8/2002 | Hopper et al. | 438/636 |
| 6,455,409 B1 | 9/2002 | Subramanian et al. | 438/618 |
| 6,465,869 B2 | 10/2002 | Ahlers et al. | |
| 6,479,352 B2 | 11/2002 | Blanchard | |
| 6,492,270 B1 | 12/2002 | Lou | 438/687 |
| 6,509,240 B2 | 1/2003 | Ren et al. | |
| 6,512,267 B2 | 1/2003 | Kinzer et al. | |
| 6,525,428 B1 | 2/2003 | Ngo et al. | 257/774 |
| 6,541,817 B1 | 4/2003 | Hurkx et al. | |
| 6,544,855 B1 | 4/2003 | Tews et al. | 438/386 |
| 6,576,516 B1 | 6/2003 | Blanchard | |
| 6,608,350 B2 | 8/2003 | Kinzer et al. | |
| 6,664,590 B2 | 12/2003 | Deboy | |
| 6,693,338 B2 | 2/2004 | Saitoh et al. | |
| 6,710,418 B1 | 3/2004 | Sapp | |
| 6,808,987 B2 | 10/2004 | Hsiao et al. | 438/257 |
| 6,878,989 B2 | 4/2005 | Izumisawa et al. | |
| 6,919,610 B2 | 7/2005 | Saitoh et al. | |
| 6,982,193 B2 | 1/2006 | Hossain | |
| 7,002,187 B1 | 2/2006 | Husher | |
| 7,019,377 B2 | 3/2006 | Tsuchiko | |
| 7,067,394 B2 | 6/2006 | So | |
| 7,176,524 B2 | 2/2007 | Loechelt et al. | |
| 7,253,477 B2 | 8/2007 | Loechelt et al. | |
| 7,285,823 B2 | 10/2007 | Loechelt et al. | |
| 7,411,266 B2 | 8/2008 | Tu et al. | |
| 7,554,140 B2 * | 6/2009 | Cho et al. | 257/288 |
| 7,799,640 B2 * | 9/2010 | Parsey et al. | 438/268 |
| 2002/0081840 A1 | 6/2002 | Matumoto | 438/672 |
| 2003/0209750 A1 | 11/2003 | Deboy et al. | |
| 2004/0175877 A1 | 9/2004 | Lin et al. | 438/200 |
| 2006/0024890 A1 | 2/2006 | Calafut | |
| 2007/0034947 A1 | 2/2007 | Loechelt et al. | |
| 2007/0052061 A1 | 3/2007 | Deboy et al. | |
| 2007/0158718 A1 | 7/2007 | Su | 257/296 |
| 2007/0278565 A1 | 12/2007 | Tu et al. | |
| 2008/0227288 A1 * | 9/2008 | Chen et al. | 438/622 |

FOREIGN PATENT DOCUMENTS

| | | |
|---|---|---|
| WO | WO2005/096389 A1 | 10/2005 |
| WO | WO2006/025035 A2 | 3/2006 |

OTHER PUBLICATIONS

M. Rub, D. Ahlers, J. Baumgartl, G. Deboy, W. Friza, O. Haberlen and I. Steinigke,"A Novel Trench Concept for the Fabrication of Compensation Devices," pp. 203-206., ISPSD 2003, Apr. 14-17, Cambridge, UK.

Deboy, G., et al., "A new Generation of High Voltage MOSFETs Breaks the Limit Line of Silicon", IEDM '98, Dec. 6-9, 1998, p. 683-5.

Lorenz, L., et al., "COOLMOS (TM)—A new Milestone in High Voltage Power MOS", ISPSD '99, May 26-28, 1999, p. 3-10.

* cited by examiner

SEMICONDUCTOR TRENCH STRUCTURE HAVING A SEALING PLUG

CROSS-REFERENCE TO RELATED APPLICATIONS

The present application is a divisional application of prior U.S. patent application Ser. No. 12/206,541, filed on Sep. 8, 2008, now U.S. Pat. No. 7,902,075 which is hereby incorporated by reference, and priority thereto for common subject matter is hereby claimed. This application is related to an application entitled "SEMICONDUCTOR DEVICE HAVING VERTICAL CHARGE-COMPENSATING STRUCTURE AND SUB-SURFACE CONNECTING LAYER AND METHOD" having an application Ser. No. 12/206,516 having a common assignee, and a common inventor, which is filed concurrently herewith.

FIELD OF THE INVENTION

This document relates generally to semiconductor devices, and more specifically to trench structures and methods of formation.

BACKGROUND OF THE INVENTION

Trench structures have several uses in semiconductor device technology. Such uses include isolation structures, control electrode structures, capacitor structures, charge-compensated super-junction structures, and buried contact structures among others. Trench structures typically are filled and/or lined with materials such as dielectrics, semi-conductive materials, conductive materials or combinations of such materials. These materials or fill materials are a common source of problems in trench structures.

For example, fill materials often cause high levels of stress within the device structure, which can in turn lead to defect formation and ultimately, device failure. Specifically, the defects create unwanted parasitic current leakage paths. Also, in some structures, silicon or polysilicon/oxide fill materials create parasitic MOS devices that can impair device performance. In addition, thermally generated carriers (electrons and holes) in semiconductor fill materials can create undesirable electric fields that can compromise breakdown or stand-off voltage of trench structures. Further, methods used to form present trench structures often incorporate contaminants in core regions of the trenches during processing. This contamination also can lead to defect formation and general impairment of device performance.

Accordingly, structures and processes are needed to effectively plug or seal trench structures while reducing stress, defects, parasitic structures, and contamination.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel devices, a person of ordinary skill in the art will appreciate that P-channel devices and complementary devices are also possible in accordance with the present invention. For clarity of the drawings, doped regions of device structures are illustrated as having generally straight-line edges and precise angular corners. However, those skilled in the art understand that due to the diffusion and activation of dopants, the edges of doped regions are generally not straight lines and the corners are not precise angles.

In addition, structures of the present description may embody either a cellular base design (where the body regions are a plurality of distinct and separate cellular regions) or a single base design (where the body region is a single region formed in an elongated pattern, typically in a serpentine pattern or a central portion with connected appendages). However, one embodiment of the present description will be described as a cellular base design throughout the description for ease of understanding. It should be understood that it is intended that the present disclosure encompass both a cellular base design and a single base design.

DETAILED DESCRIPTION OF THE DRAWINGS

In general, the present description pertains to a semiconductor device having one or more trench structures with a plug that seals or partially seals core regions of the one or more trenches. Specifically, a single crystal epitaxial semiconductor layer or substantially homogeneous semiconductor layer or plug is formed along upper sidewall surfaces of a trench. The thickness of the single crystal epitaxial layer is selected to seal or partially seal the core regions at upper portions of the trench. The following detailed description uses two example embodiments to illustrate the present invention. The first embodiment comprises a semiconductor device having a trench isolation structure, and the second embodiment comprises an insulated gate field effect transistor (IGFET) device having charge-compensated trenches. It is understood that the present invention is not limited to these two examples.

Figure 1:
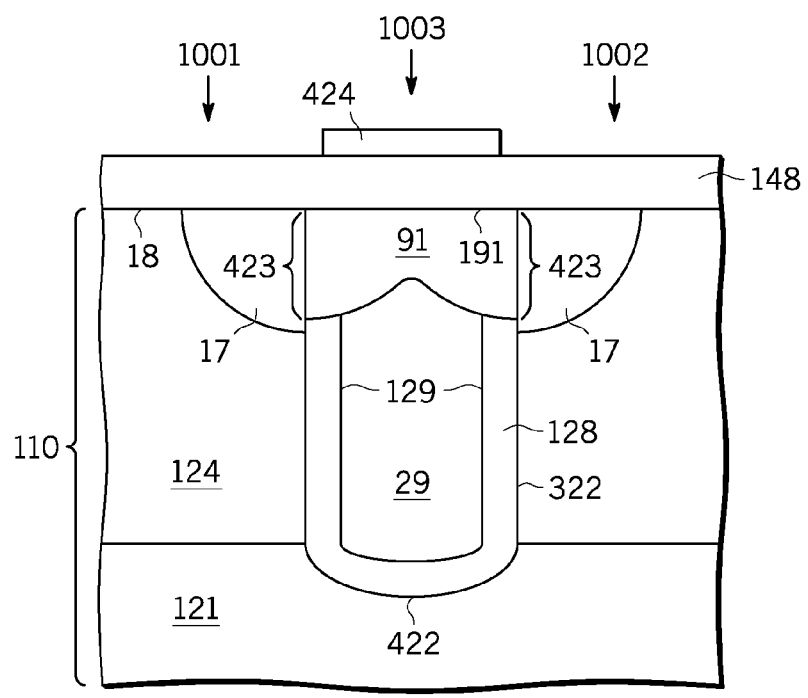
FIG. 1 illustrates an enlarged partial cross-sectional view of a semiconductor device in accordance with a first embodiment of the present invention.

FIG. 1 shows a partial cross-sectional view of a semiconductor device 10 having one or more isolation trench structures 322 in accordance with a first embodiment of the present invention. It is understood that isolation trench structures 322 comprise a plurality of individual trench structures, cells, stripes, or one continuous trench matrix. Device 10 includes a body or region of semiconductor material 110, which comprises for example, a p-type silicon substrate 121, and a semiconductor layer or well region 124 that comprises n-type conductivity. In one embodiment, semiconductor layer 124 is formed using conventional epitaxial growth techniques. In another embodiment, well region 124 is formed using conventional doping and diffusion techniques. Other materials may be used for semiconductor material 110 or portions thereof including silicon-germanium, silicon-germaniumcarbon, carbon-doped silicon, III-V materials, dielectric materials, or the like. Additionally, in one embodiment semiconductor material 110 includes a buried layer between substrate 121 and semiconductor layer 124.

In this embodiment, trench structure 322 comprises a trench 422 extending from major surface 18 of semiconductor material 110. In one embodiment, trench 422 extends through semiconductor layer 124 and reaches substrate 121. In another embodiment, trench 422 extends partially into semiconductor layer 124. A dielectric layer (or layers) 128 is formed overlying lower sidewall and lower surfaces of trench 422 while leaving upper sidewall surfaces of trench 422 exposed or uncovered. By way of example, dielectric layers 128 comprise an oxide, a nitride, combinations of the two, or the like. In one example, dielectric layer 128 comprises about 0.15 microns to about 0.25 microns of silicon dioxide. In another embodiment, a silicon nitride layer about 0.05 microns to about 0.1 microns is formed overlying the silicon dioxide layer.

In accordance with the present invention, isolation trench structure 322 further includes a plug, conformal plug, single crystalline sealing structure, substantially homogeneous plug or epitaxial cap structure or layer 91. Preferably, plug 91 comprises an epitaxially grown single crystalline semiconductor structure extending from upper exposed sidewall portions 423 of trench 422. By exposed, it is meant that layers 128 are absent from sidewall portions 423, which exposes portions of semiconductor material 110/124 to provide a substantially single crystalline interface in which to grow single crystal epitaxial material. In one embodiment, plug 91 comprises p-type conductivity when semiconductor layer 124 comprises n-type conductivity. That is, the conductivity type of plug 91 is opposite to that of semiconductor layer 124. Plug 91 has a dopant concentration sufficient to provide isolation between regions 1001 and 1002 of device 10. By way of example, plug 91 has a dopant concentration in range from about $1.0 \times 10^{17}$ atoms/cm$^3$ to about $1.0 \times 10^{19}$ atoms/cm$^3$.

In one embodiment, plug 91 completely seals trench 422 to provide a sealed core or centrally located void region 29. That is, core 29 is absent solid material. In one embodiment, core 29 comprises a sealed volume containing a gas such as hydrogen. In one embodiment, core 29 is under a vacuum of less than about 20 Torr with 5 to 10 Torr being typical. In another embodiment, plug 91 partially seals trench structure 322 leaving a substantially centrally located gap in plug 91. In one embodiment, selective epitaxial growth techniques are used to form plug 91, which leaves exposed major surfaces 129 of dielectric layers 128 substantially absent semiconductor material (i.e., plug 91 does not overlie major surfaces 129), which among other things simplifies processing and reduces stress. Also, this reduces issues associated with thermally generated carriers, which can create undesirable electric fields that compromise breakdown or stand-off voltage of the structure. Additionally, this eliminates any parasitic MOS transistor characteristics particularly when plug 91 is doped. In one embodiment, plug 91 is planarized so that its upper surface 191 is at about the same level or in proximity to major surface 18. This is not required, but is useful in space sensitive applications.

Plugs 91 provide, among other things, a reduced stress sealing configuration that also reduces contaminant incorporation within trench 422. For example, because plug 91 can be configured to provide a complete seal, it is not necessary to completely fill core region 29 with stress-inducing materials such polysilicon or the like. Also, because plug 91 can be configured to provide a complete seal overlying trench 422, contaminants are not incorporated into the core region of the trench during subsequent processing.

Device 10 further includes optional isolation regions 17 that are, for example, doped p-type (i.e., opposite to the conductivity type of semiconductor layer 124) to provide additional isolation. In this optional embodiment, plugs 91 may be doped or undoped. Isolation regions 17 are formed before or after plugs 91 are formed using conventional techniques. Device 10 is further shown with a dielectric layer 148 formed overlying or adjacent to major surface 18. By way of example, dielectric layer 148 comprises an oxide, a nitride, combinations of the two, or the like. As shown, isolation trench structure 322 provides isolation between regions 1001 and 1002. Additionally, isolation trench structure 322 provides an isolated region 1003 for forming a component 424 such as a passive component. For example, component 424 is a capacitor, an inductor, an input/output pad or any structure where isolation from semiconductor material 110 or a portion thereof is desired.

Figure 2:
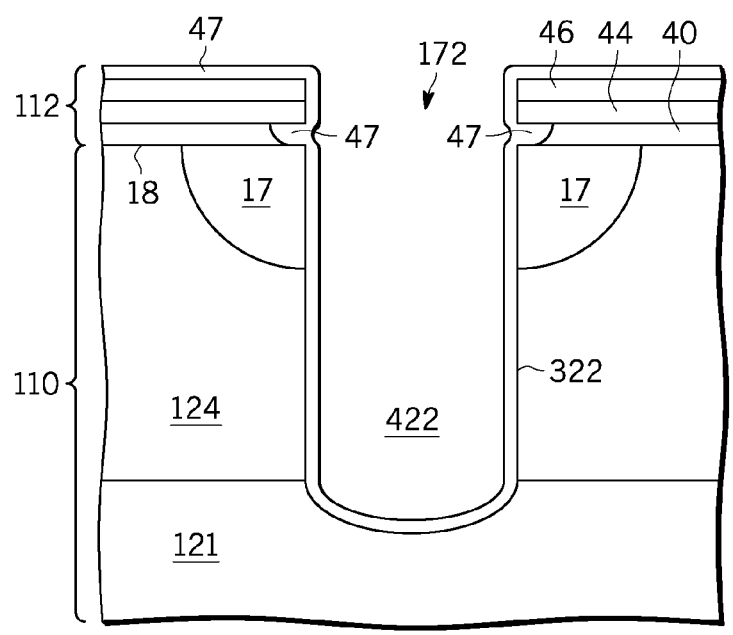
FIGS. 2-6 illustrate enlarged partial cross-sectional views of the semiconductor device of FIG. 1 at various stages of fabrication.

Turning now to FIGS. 2-6, a method for forming isolation trench 322 of FIG. 1 is described. FIG. 2 shows a partial cross-sectional view of device 10 at an early step in fabrication. In an early step, isolation regions 17 are formed using, for example, conventional masking and doping techniques. As stated previously, isolation regions 17 are optional and may be omitted. Next, a dielectric layer 40 is formed overlying major surface 18, and comprises for example, a thermal oxide about 0.03 microns thick. A dielectric layer 44 comprising a different material than dielectric layer 40 is then formed overlying dielectric layer 40. By way of example, dielectric layer 44 is a silicon nitride when first dielectric layer 40 is a silicon oxide. In one embodiment, dielectric layer 44 is approximately 0.2 microns of silicon nitride, and is formed using conventional deposition techniques. Next, a dielectric layer 46 is formed overlying dielectric layer 44 and comprises approximately 0.6 microns of deposited silicon dioxide. These layers provide a hard mask structure 112 for subsequent processing. Opening 172 is then formed using conventional techniques to remove portions of layers 46, 44, and 40 to expose a portion of major surface 18.

Next, trench 422 is formed through opening 172 extending from major surface 18 into semiconductor layer 124. In one embodiment, trench 422 extends into at least a portion of substrate 121. In one embodiment, the depth of trench 422 is determined by the thickness of semiconductor layer 124.

In one embodiment, Deep Reactive Ion Etching (DRIE) etching with a fluorine or chlorine based chemistry is used to form trench 422. Several techniques are available for DRIE etching trench 422 including cryogenic, high-density plasma, or Bosch DRIE processing. In one embodiment, trench 422 has substantially vertical sidewalls. In an alternative embodiment, trench 422 has a tapered profile where the width of the trench at the trench lower surface is less than the width in proximity to major surface 18. In another embodiment where a larger gap may be desired to further enhance isolation capabilities (both laterally and vertically) trench 422 has an expanded profile where the width of the trench at the lower surface is greater than the width of the trench in proximity to major surface 18. In one embodiment, the depth of trench 422 is in a range from about 3.0 microns to about 100 microns. During the trench cleaning process, a short selective etch is typically used that may undercut dielectric layer 40 as shown in FIG. 2. To prevent any further undercutting of dielectric layer 40, a polysilicon layer 47 is formed overlying major surface 18 including sidewall and lower surfaces of trench 422 and filling the undercut regions of dielectric layer 40.

Figure 3:
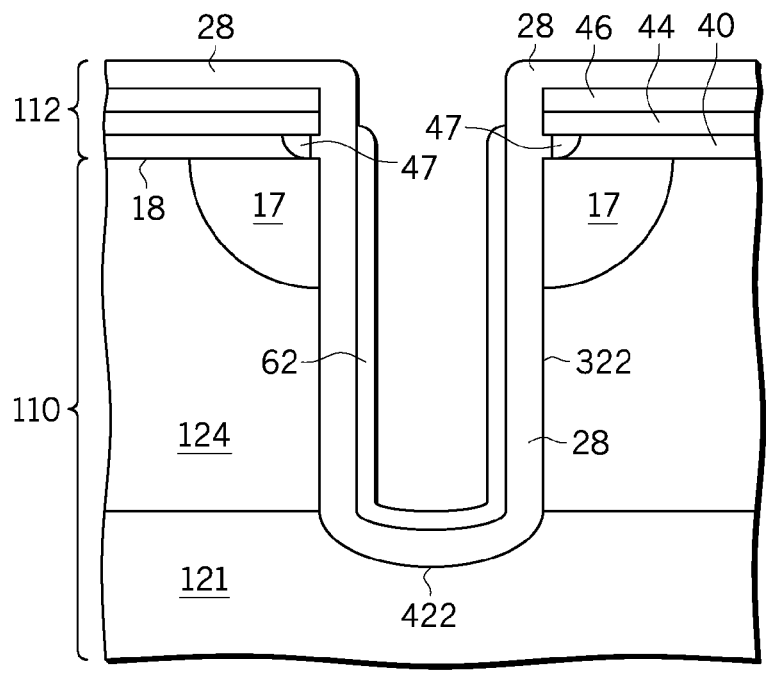

FIG. 3 shows an enlarged partial cross-sectional view of device 10 at a further stage of fabrication. A first dielectric layer 28 is formed overlying major surface 18 including sidewall and lower surfaces of trench 422. By way of example, first dielectric layer 28 comprises an oxide. In one embodiment, 0.04 microns of dry oxide is formed consuming polysilicon layer 47 but retaining that portion of polysilicon layer 47 in the undercut regions of layer 40, followed by about 0.2 microns of deposited oxide. Next, a second dielectric layer is formed overlying first dielectric layer 28. In one embodiment, the second dielectric layer comprises about 0.1 microns of silicon nitride. Conventional deposition techniques are used to form the first and second dielectric layers. Conventional dry etching techniques are then used to etch back the second dielectric layer leaving dielectric spacers, spacer layers, or dielectric layers 62 within trench 422 as shown in FIG. 3. Dependent upon the etch process used and the aspect ratio of trench 422, dielectric layers 28 and 62 may be etched off the lower surface of trench 422 or left in place as shown in FIG. 3. In lower aspect ratio trenches, conventional masking steps may be used to prevent dielectric layers 28 and 62 from being removed at the lower surface of trench 422.

Figure 4:
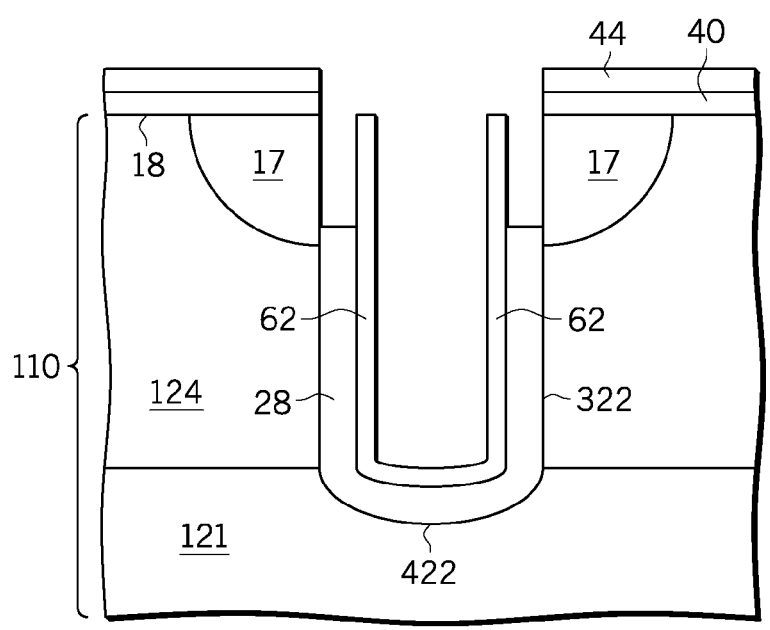
Figure 5:
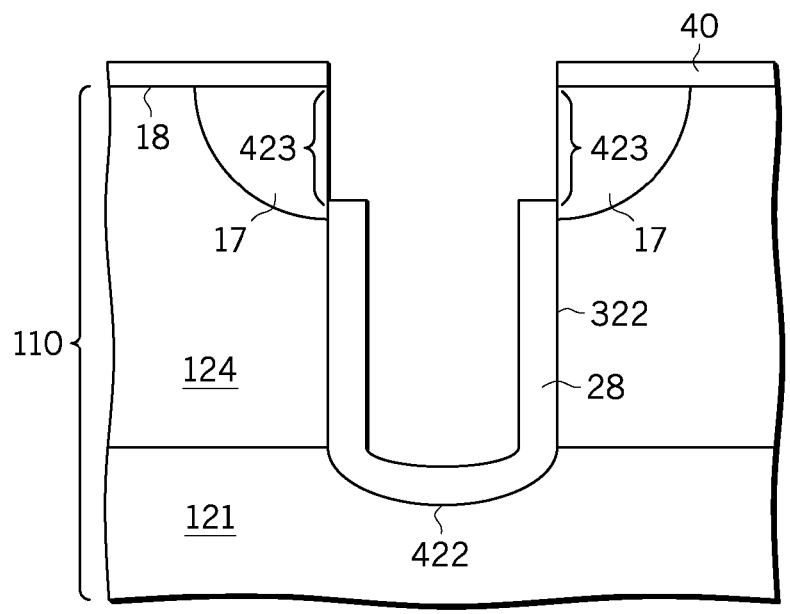

Next as shown in FIG. 4, which is an enlarged partial cross-sectional view of device 10 after further processing, dielectric layer 28 is exposed to an additional selective etching step to remove an upper portion of the dielectric material so that dielectric layer 28 is recessed from upper surfaces of dielectric layer 62. If the lower portions of dielectric layers 28 and 62 were removed in the step described in conjunction with FIG. 2, the selective etch would also remove dielectric layer 28 from the open area exposed at the bottom of trench 422. By way of example, when dielectric layer 28 comprises an oxide, an isotropic etch such as a diluted HF wet etch (e.g., 10:1 for about 8-11 minutes) is used to recess dielectric layer 28 approximately 1.2 microns below dielectric layer 62. During these steps, dielectric layer 46 also may be removed. Dielectric layers 62 and 44 are then removed using conventional material removal techniques as shown in FIG. 5 to provide exposed portions 423 of semiconductor material 110 at upper portions of trench 422. This process provides a very controllable way to form exposed portions 423 compared to processes that rely on anisotropic etching.

Figure 6:
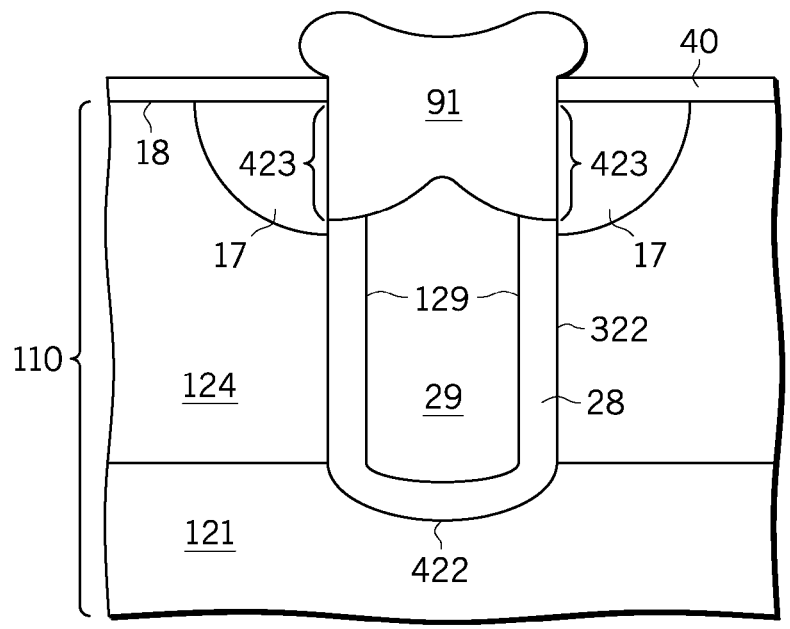

FIG. 6 shows an enlarged partial cross-sectional view of device 10 after additional processing. In accordance with a preferred embodiment, an epitaxial plug, single crystalline plug, plug of semiconductor material, or homogeneous semiconductor plug region 91 is formed within the opening of trench 422 above dielectric layer 28 and along exposed portions 423 of semiconductor layer 124. In accordance with this embodiment, plug 91 comprises an epitaxial semiconductor material that has an opposite conductivity type to semiconductor layer 124. In the embodiment shown plug 91 is p-type. In one embodiment, plug 91 has a dopant concentration between about $1.0 \times 10^{17}$ atoms/cm$^3$ and about $1.0 \times 10^{19}$ atoms/cm$^3$. In an alternative embodiment, plug 91 is undoped.

In one embodiment for forming plug 91, a dichlorosilane source gas is used with hydrogen and HCl, which makes the growth selective to exposed portions 423 only. In alternative embodiments, silane, disilane, or trichlorosilane source gases are used. Depending on the growth temperature selected, epitaxial reactor pressure is set within a range from approximately ten Torr to atmospheric. In one embodiment, a single wafer reactor is used with a reactor pressure of about 20 Torr during the growth process. Suitable growth temperatures for dichlorosilane are in a range from about 950 degrees Celsius to about 1050 degrees Celsius. Suitable growth temperatures for silane or disilane are in range from about 575 degrees Celsius to about 700 degrees Celsius. Suitable growth temperatures for trichlorosilane are in a range from about 1000 degrees Celsius to about 1200 degrees Celsius. In one embodiment, plug 91 has a thickness in a range from about 0.10 microns to about 0.60 microns. It is understood that the thickness of plug 91 is adjusted according to the width of trench 422. By way of example, thickness is adjusted depending on the desired structure of plug 91 (e.g., near-closure, complete closure, or overgrowth).

In one embodiment, a growth rate of about 0.30 microns per minute is used when a selective epitaxial growth technique and dichlorosilane are used. When a non-selective epitaxial growth technique and dichlorosilane are used, a growth rate in a range of about 1.0 micron per minute to about 2.0 microns per minute is used. Gas flow rates depend on reactor configuration, and are set by the growth conditions and structure required. In one embodiment, the following gas flows ranges were used in a selective growth process to form plug 91 in a closed configuration using dichlorosilane: 30-40 standard liters per minute (slm) of hydrogen, 0.70-0.80 slm HCl, and 0.20-0.25 slm dichlorosilane.

In accordance with a preferred embodiment, plug 91 is configured to seal off trench 422 to form sealed core 29, and is further configured to do so with minimal defects and negligible stress compared to structures that use dielectric/polysilicon or polysilicon fill techniques. By suppressing defects and stress, the reliability and quality of device 10 is improved. In one embodiment, when selective epitaxial growth techniques are used to form plug 91, major surfaces 129 of dielectric layers 28 are substantially absent semiconductor material (i.e., plug 91 does not overlie major surfaces 129), which among other things simplifies processing and reduces stress. Also, this reduces issues associated with thermally generated carriers. Additionally, this eliminates any parasitic MOS transistor characteristics particularly when plug 91 is doped. In one embodiment, sealed core 29 is under a vacuum of about 20 Torr with some hydrogen present in sealed core 29 from the epitaxial growth process.

Figure 7:
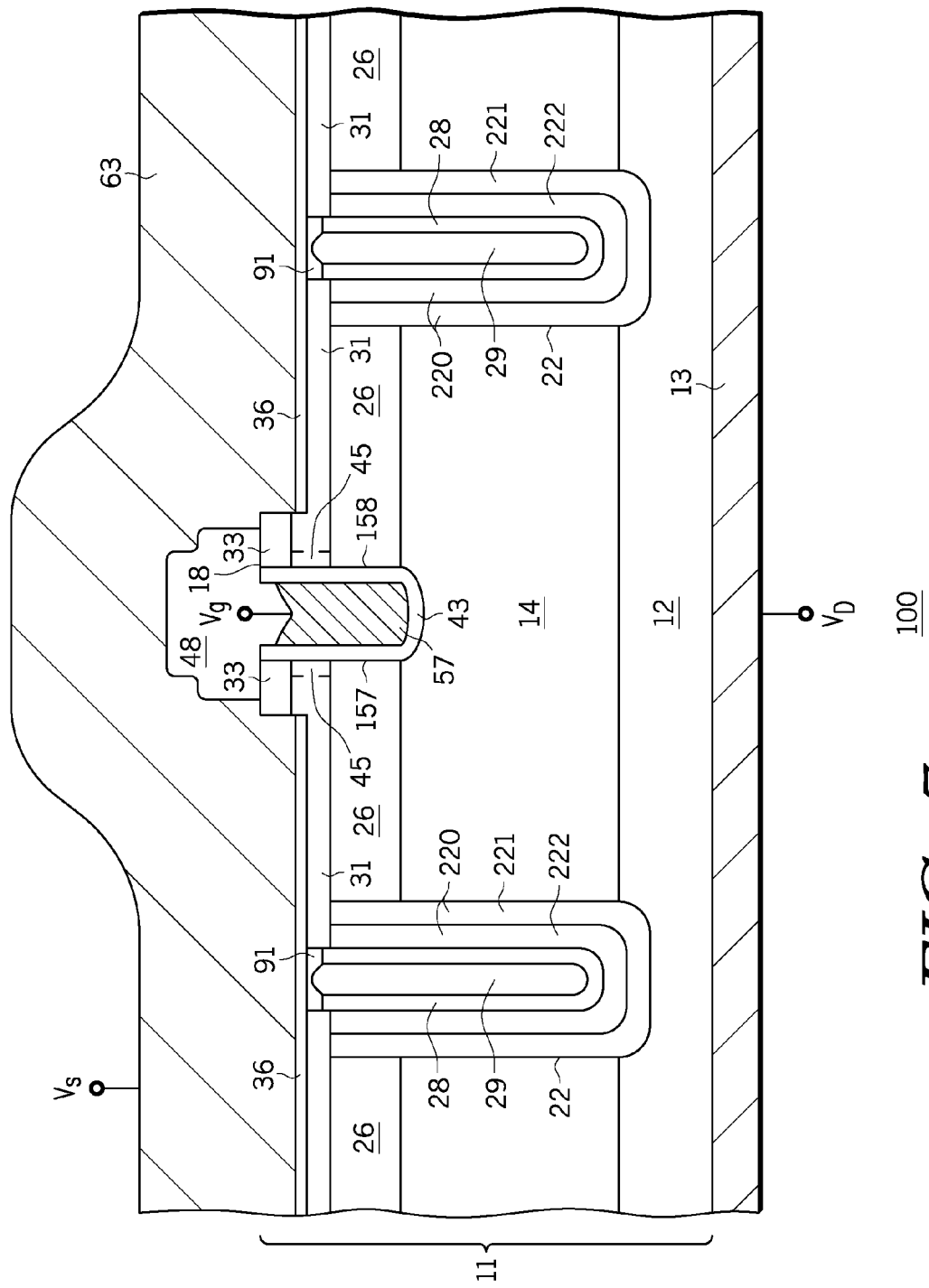
FIG. 7 illustrates an enlarged partial cross-sectional view of a semiconductor device in accordance with a second embodiment of the present invention.

FIG. 7 shows a partial cross-sectional view of an insulated gate field effect transistor (IGFET), MOSFET, superjunction device, superjunction structure, charge-compensated or switching device or cell 100 in accordance with a second embodiment of the present invention. By way of example, device 100 is among many such devices integrated with logic and/or other components into a semiconductor chip as part of a power integrated circuit. Alternatively, device 100 is among many such devices integrated together to form a discrete transistor device.

Device 100 includes a region of semiconductor material 11, which comprises for example, an n-type silicon substrate 12 having a resistivity in range of approximately 0.001 to about 0.01 ohm-cm, and may be doped with arsenic or phosphorous. In the embodiment shown, substrate 12 provides a drain region for device 100, which is adjacent to conductive layer 13. A semiconductor layer 14 is formed in or on substrate 12 and is n-type or p-type and doped light enough so as to not impact charge balance in the trench compensation regions described below. In one embodiment, layer 14 is formed using conventional epitaxial growth techniques. In an embodiment suitable for a 600 volt (BVdss) device, layer 14 is doped n-type or p-type with a dopant concentration of about $1.0 \times 10^{13}$ atoms/cm$^3$ to about $1.0 \times 10^{14}$ atoms/cm$^3$, and has a thickness on the order of about 40 microns to about 60 microns. Note that although semiconductor layer 14 is shown as thicker than substrate 12 in the drawings, in reality substrate 12 is thicker. It is shown this way for ease of understanding in the drawings.

In one embodiment, a portion of layer 14 is doped p-type in the active region portion of device 100, while another portion of layer 14 is doped n-type in the edge termination portion of the device. The thickness of layer 14 is increased or decreased depending on the desired BVdss rating of device 100. In an alternative embodiment, semiconductor layer 14 comprises a graded dopant profile with semiconductor layer 14 having a higher dopant concentration in proximity to substrate 12, and transitioning either gradually or abruptly to a lower concentration for the balance of its thickness towards major surface 18.

Other materials may be used for body of semiconductor material 11 or portions thereof including silicon-germanium, silicon-germanium-carbon, carbon-doped silicon, III-V materials, or the like. Additionally, those skilled in the art will understand that an insulated gate bipolar transistor (IGBT) device is achieved with the present structure by, for example, changing the conductivity type of substrate 12 to p-type (i.e., opposite to semiconductor layer 14).

Device 100 further includes spaced apart filled trenches, compensating trenches, semiconductor material filled trenches, charge-compensated trench regions, deep trench charge compensation regions, charge-compensated filled trenches, compensation trenches, localized vertical charge compensation structures, or localized charge compensation regions 22. As used herein, charge compensation generally means that the total charge of the opposite conductivity type layers is substantially or generally balanced or equal. Charge-compensated filled trenches 22 include a plurality of layers or multiple layers of semiconductor material 220, including at least two layers of opposite conductivity type (i.e., at least one each of n-type and p-type), which may be separated by an intrinsic, buffer, or lightly doped semiconductor layer or layers. As shown in FIG. 7, material 220 includes a layer 221 of n-type semiconductor material adjoining semiconductor layer 14 along sidewall surfaces of the trenches.

In accordance with a preferred embodiment, layers 221 are of the same conductivity type as source regions 33, and form a primary vertical low resistance current path from the channel to the drain when device 100 is in the on-state. A layer 222 of compensating p-type semiconductor material is formed overlying layer 221. By way of example, n-type layers 221 and p-type layers 222 have a dopant concentration on the order of about $9.0 \times 10^{15}$ to about $5.0 \times 10^{16}$ atoms/cm$^3$, and each has a thickness of about 0.1 microns to about 0.3 microns respectively. When device 100 is in an off-state, p-type layers 222 and n-type layers 221 compensate each other to provide an increased BVdss characteristic. Although no buffer layers are shown in the device of FIG. 7, it is understood that they may be present in earlier steps in fabrication. In a preferred embodiment, layers of semiconductor material 220 comprise a single crystalline semiconductor material. Additional details regarding charge-compensated trenches 22 and layers of semiconductor material 220 are described below in conjunction with FIGS. 4 and 5.

In a preferred embodiment, device 100 includes a dielectric layer 28 formed overlying portions of layers of semiconductor material 220. Preferably, dielectric layer 28 is formed overlying a portion of sidewall surfaces and lower surfaces of layers of semiconductor material 220 while leaving upper sidewall portions exposed. This is shown for example in FIG. 7. In one embodiment, dielectric layer 28 is a deposited silicon oxide layer having a thickness of about 0.2 microns. In the embodiment shown, charge-compensated trenches 22 are configured or formed with a void or sealed core 29 at a centrally located portion and are capped with a plug structure 91. In a preferred embodiment, plugs 91 comprise a single crystal semiconductor material, which is epitaxially grown along upper portions of layers of semiconductor material 220 to seal off charge-compensated trenches 22. In one embodiment, the single crystal semiconductor material is subsequently planarized so that upper surfaces of plugs 91 are in proximity to major surface 18. In an alternative embodiment, charge-compensated trenches 22 are voidless, and filled with materials such as dielectrics, polycrystalline semiconductor material, single crystal semiconductor material, or combinations thereof.

Although not shown, it is understood that during the formation of device 100, n-type dopant from highly doped substrate 12 diffuses into the lower portions of charge-compensated trenches 22 so that those portions of trenches 22 within substrate 12 become more heavily doped n-type.

Device 100 also includes a well, base, body or doped regions 31 formed in semiconductor layer 14 between and in proximity to, adjacent to, or adjoining charge-compensated trenches 22. Body regions 31 extend from major surface 18 of semiconductor material 11. In one embodiment, body regions 31 comprise p-type conductivity, and have a dopant concentration suitable for forming an inversion layer that operates as conduction channels 45 of device 100. Body regions 31 extend from major surface 18 to a depth of about 1.0 to about 5.0 microns. As stated above, body regions 31 comprise a plurality of individually diffused regions or comprise a connected, single or commonly diffused region of selected shape.

N-type source regions 33 are formed within, above, or in body regions 31 and extend from major surface 18 to a depth of about 0.2 microns to about 0.5 microns. In the embodiment shown, portions of major surface 18 extend down and then outward from the edges of source regions 33 so that contact is made to horizontal and vertical surfaces of source regions 33 by source contact layer 63. One or more p-type body contact regions 36 are formed in at least a portion of each body region 31. Body contact regions 36 are configured to provide a lower contact resistance to body region 31, and to lower the sheet resistance of body regions 31 under source regions 33, which suppresses parasitic bipolar transistor effects.

In accordance with a preferred embodiment, body contact regions 36 and body regions 31 overlie charge-compensated trenches 22 as shown in FIG. 7, and together with source contact layer 63 are configured to provide ohmic contact to and continuity with p-type layers 222 in charge-compensated trenches 22. This ohmic contact structure is configured to provide a grounded structure for p-type layers 222, which eliminates lateral electric fields at major surface 18 and improves the breakdown voltage performance of device 100. This structure also grounds the effects of any defects present in proximity to major surface 18 and within or in proximity to charge-compensated trenches 22. The structure of device 100 greatly simplifies the ability to make contact to layers 222, which is necessary for optimum device performance. In particular, device 100 avoids using any complex topography overlying the upper portion of charge-compensated trenches 22, which simplifies the ohmic contact structure and method.

Device 100 further includes a trench gate or control structure 157 adjoining body regions 31 and source regions 33. Control structure 157 is laterally spaced apart from adjacent charge-compensated trenches 22. That is, control structure 157 does not overlie charge-compensated trenches 22. Trench gate structure 157 includes a gate trench 158 and a gate dielectric layer 43 formed overlying surfaces of gate trench 158. In one embodiment, gate dielectric layer 43 comprises a silicon oxide, and has a thickness of about 0.05 microns to about 0.1 microns. In another embodiment, gate dielectric layer 43 has a thickness at the lower surfaces of gate trench 158 that is greater or thicker than the thickness of gate dielectric layer 43 along the sidewalls of gate trench 158. In alternative embodiments, gate dielectric layer 43 comprises silicon nitride, tantalum pentoxide, titanium dioxide, barium strontium titanate, or combinations thereof including combinations with silicon oxide, or the like.

Trench gate structure 157 further includes a conductive gate region 57 formed within control or gate trench 158 and overlies gate dielectric layer 43. In one embodiment, a source region 33 is interposed between a conductive gate region 57 and a charge compensation trench 22. Conductive gate region 57 comprises, for example, n-type polysilicon. Although conductive gate region 57 is shown as recessed below major surface 18, conductive gate region 57 may extend higher or above major surface 18. Trench gate structure 157 is configured to control the formation of channels 45 and the conduction of current in device 100.

To facilitate a sub-surface current path, device 100 further includes n-type doped layers or sub-surface doped layers 26. Specifically, doped layers 26 are configured to provide a sub-surface conduction path between the drain end of channels 45 and n-type layers 221, which are the primary conduction layers or vertical conduction paths in charge compensation trenches 22. That is, in device 100 current flows vertically through channels 45, then horizontally through doped layers 26, and then vertically through layers 221. Doped layers 26 are configured so that current flow is isolated from major surface 18 by body regions 31 and body contact regions 36, which are opposite conductivity types (p-type) from doped layers 26 (n-type). This isolation feature keeps the conduction path away from defect regions near the surface thereby avoiding any conduction related problems. Moreover, the grounded p-type layer 222 structure further isolates the effects of any high defect density regions from the primary conduction path. In addition, by placing body regions 31 and body contact regions 36 so that they overlie doped regions 26, a preferred concave-shaped junction is provided, which surrounds n-type layers 221 and doped layer 26. This beneficially enhances BVdss.

Device 100 further includes an interlayer dielectric region 48 formed overlying major surface 18, which is patterned to provide openings to body contact regions 36 and source regions 33. A portion of interlayer dielectric region 48 is left overlying trench gate structure 57 to provide isolation for conductive gate region 57. Interlayer dielectric region 48 comprises for example, a silicon oxide such as a deposited oxide, and has a thickness from about 0.4 microns to about 1.0 microns.

Source contact layer 63 is formed overlying major surface 18 and makes contact to both source regions 33 and body contact regions 36. In one embodiment, source contact layer 63 comprises a titanium/titanium nitride barrier layer and an aluminum silicon alloy formed overlying the barrier layer, or the like. Drain contact layer 13 is formed overlying an opposing surface of semiconductor material 11, and comprises, for example, a solderable metal structure such as titanium-nickel-silver, chrome-nickel-gold, or the like. In the alternative, layer 13 comprises a conductive epoxy or the like.

In summary, the structure and method of device 100 places primary conduction layer 221 adjacent the sidewall surface of charge-compensated trenches 22. Device 100 uses a trench gate control structure 157, which places the drain end of channel 45 spaced apart, away, or sub-surface from major surface 18. Device 100 incorporates sub-surface doped layers 26 that electrically connect the sub-surface drain ends of channels 45 to primary conduction layers 221 in charge-compensated trenches 22. This approach moves the primary current path away from the surface of the device, which makes it much less susceptible to stress issues and defects thereby improving performance. In addition, because the primary current path of device 100 is configured this way, forming the ohmic contact structure between p-type compensating doped layers 222, body regions 31, body contact regions 36 and source contact layer 63 is simplified.

The operation of device 100 proceeds as follows. Assume that source terminal 63 is operating at a potential $V_S$ of zero volts, conductive gate regions 157 receive a control voltage $V_G$=5.0 volts, which is greater than the conduction threshold of device 100, and drain terminal 13 operates at drain potential $V_D$=5.0 volts. The values of $V_G$ and $V_S$ cause body region 31 to invert adjacent conductive gate regions 157 to form vertical channels 45, which electrically connect source regions 33 to doped layers 26. A device current $I_D$ flows from drain terminal 13 and is routed through n-type layers 221, doped layer 26, channels 45, source regions 33, to source terminal 63. Hence, current $I_D$ flows vertically through n-type layers 221 to produce a low on resistance, and horizontally through sub-surface doped layers 26 keeping the current path isolated from major surface 18. In one embodiment, $I_D$=1.0 amperes. To switch device 100 to the off state, a control voltage $V_G$ of less than the conduction threshold of the device is applied to conductive gate regions 157 (e.g., $V_G$<5.0 volts). This removes channels 45 and $I_D$ no longer flows through device 100. In the off state, n-type layers 221 and p-type layers 222 compensate each other as the depletion region from the primary blocking junction spreads, which enhances BVdss. Another advantage of device 100 is that the simplified ohmic contact structure between p-type compensating doped layers 222, body region 31, body contact region 36 and source contact layer 63 enhances switching characteristics. For example, when device 100 switches from an on state to an off state, the ohmic contact pulls both electrons and holes from the structure more efficiently.

Figure 8:
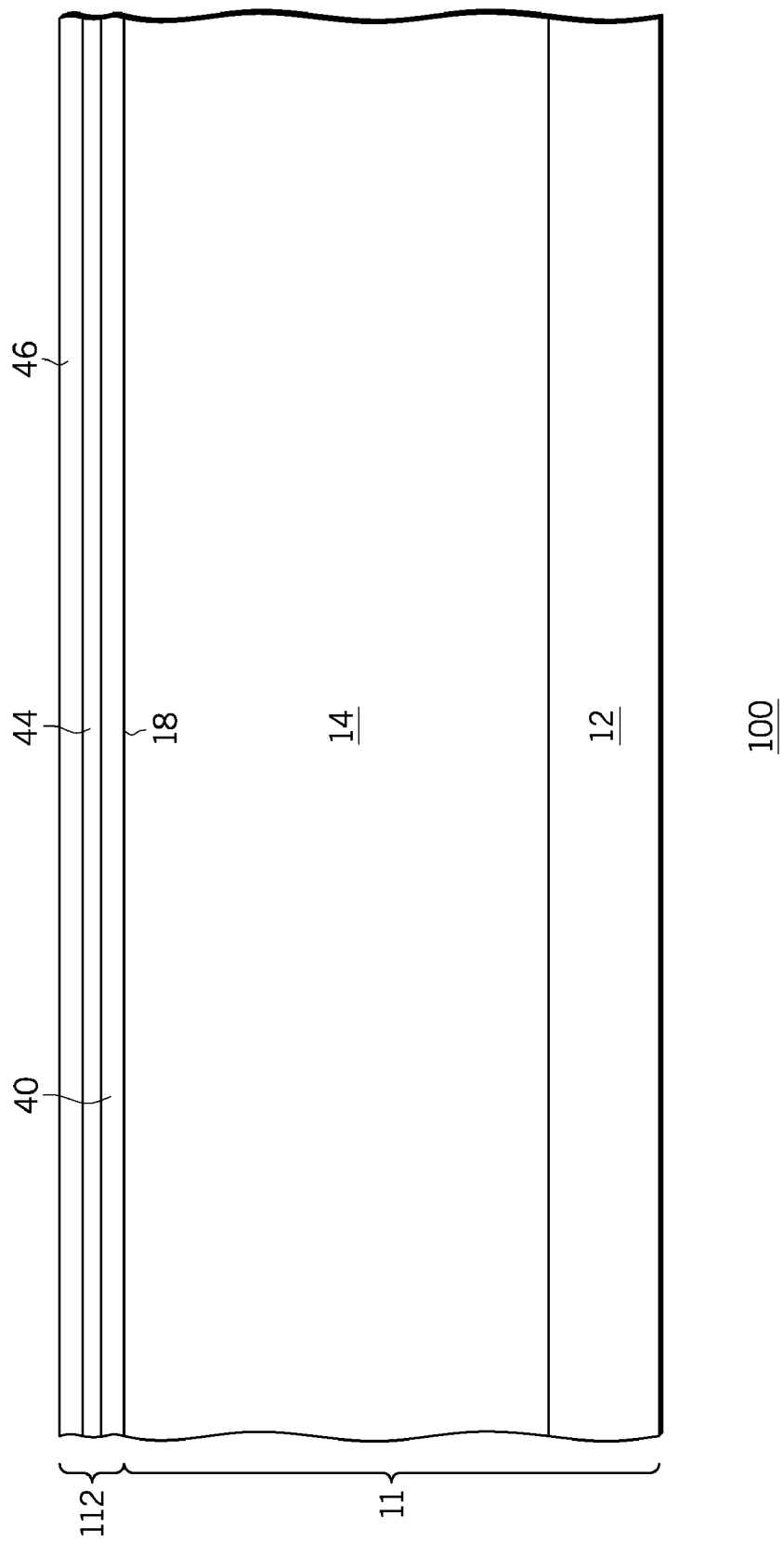
FIGS. 8-20 illustrate enlarged partial cross-sectional views of the semiconductor device of FIG. 7 at various stages of fabrication.

Turning now to FIGS. 8-20, a process for forming device 100 in accordance with a preferred embodiment is described. FIG. 8 shows an enlarged partial cross-sectional view of device 100 at an early stage of fabrication. An example of the material characteristics of body of semiconductor material 11 was provided in conjunction with FIG. 7 above. In an early step, a dielectric layer 40 is formed overlying major surface 18, and comprises for example, a thermal oxide about 0.2 microns thick. A dielectric layer 44 comprising a different material than dielectric layer 40 is then formed overlying dielectric layer 40. By way of example, dielectric layer 44 is a silicon nitride when first dielectric layer 40 is a silicon oxide. In one embodiment, dielectric layer 44 is approximately 0.2 microns of silicon nitride, and is formed using conventional deposition techniques. Next, a dielectric layer 46 is formed overlying dielectric layer 44 and comprises approximately 0.6 microns of deposited silicon dioxide. These layers provide an example of a hard mask structure 112 for subsequent processing.

Figure 9:
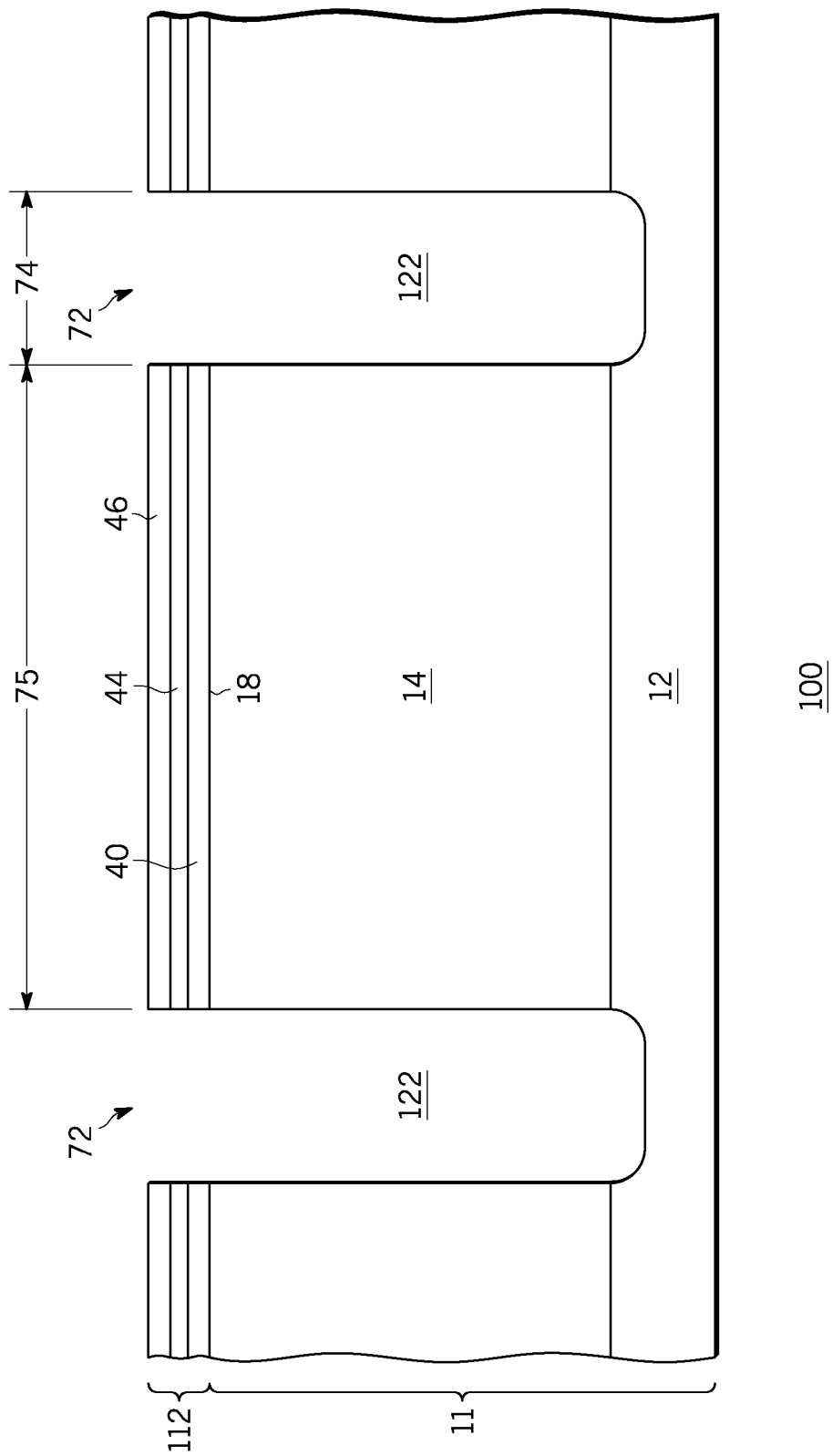

FIG. 9 shows an enlarged partial cross-sectional view of device 100 at a subsequent stage of fabrication. Hard mask structure 112 is patterned using conventional photolithographic and material removal techniques to form openings 72, which expose portions of major surface 18. By way of example, openings 72 have a width 74 of about 3.0 microns to about 4.0 microns. Next, trenches 122 are formed through openings 72 extending from major surface 18 into semiconductor layer 14. In one embodiment, semiconductor layer 14 has a width 75 between adjacent trenches 122 of about 2.0 microns to 3.0 microns. To ease the understanding of this embodiment, width 75 is shown greater than width 74 with the understanding that width 75 may be less than or equal width 74. In one embodiment, trenches 122 extend into at least a portion of substrate 12. The depth of trenches 122 is determined by the thickness of semiconductor layer 14, which is a function of BVdss requirements.

In one embodiment, Deep Reactive Ion Etching (DRIE) etching with a fluorine or chlorine based chemistry is used to form trenches 122. Several techniques are available for DRIE etching trenches 122 including cryogenic, high-density plasma, or Bosch DRIE processing. In one embodiment, trenches 122 have substantially vertical sidewalls. In an alternative embodiment, trenches 122 have a tapered profile where the width of the trench at the trench lower surface is less than width 74. Although trenches 122 are stated as plural, it is understood that trenches 122 may be a single continuous trench or connected trench matrix. Alternatively, trenches 122 may be a plurality of individual trenches with closed ends and separated by portions of body of semiconductor material 11. The depth of trenches 122 is in a range from about 3.0 microns to about 100 microns.

Figure 10:
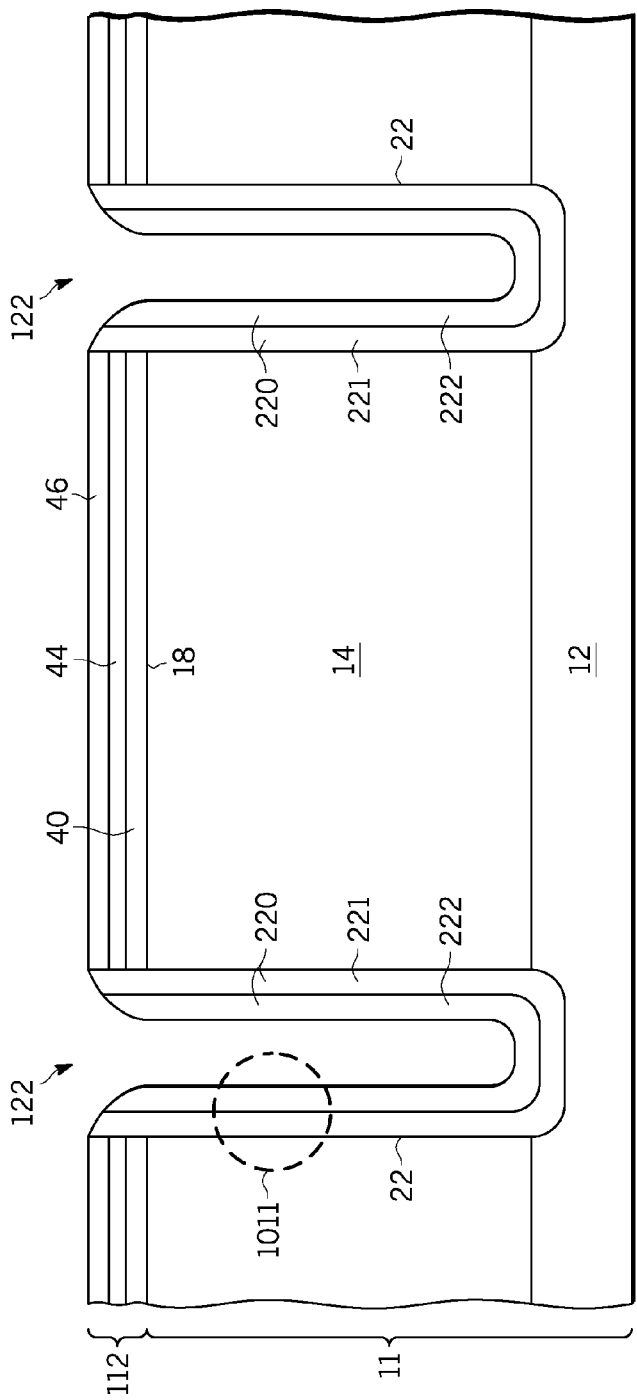

FIG. 10 shows an enlarged partial cross-sectional view of device 100 at a later stage of fabrication. At this point, layers of semiconductor material 220 are formed, grown, or deposited in trenches 122 as a first step in forming charge-compensated trenches 22. In one embodiment, single crystal semiconductor epitaxial growth techniques are used to form layers of semiconductor material 220.

In a first step, a thin oxide such as a thermal oxide (not shown) is formed on the sidewalls of trenches 122 to remove any surface damage caused by the material removal step. The thin oxide is then removed using conventional isotropic etching techniques (e.g., 10:1 wet oxide strip). Next, semiconductor material 11 is placed into an epitaxial growth reactor and pre-cleaned as a first step in the epitaxial growth process. When silicon is the selected semiconductor material for forming layers of semiconductor material 220, silicon source gases such as trichlorosilane ($SiHCl_3$), dichlorosilane ($SiH_2Cl_2$), silane ($SiH_4$) or disilane ($Si_2H_6$) are suitable for forming these layers.

Figure 11:
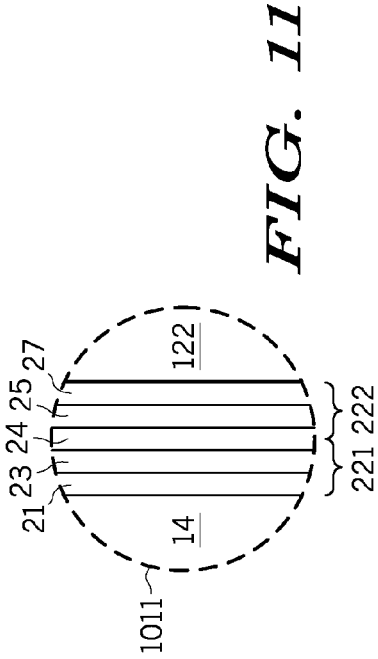

With reference now to FIG. 11, which is a partial cross-sectional view of a portion 1011 of trench 122 in FIG. 10, the formation of a preferred embodiment of layers of semiconductor material 220 is described. In a preferred embodiment, all layers that make up layers of semiconductor material 220 are grown in continuous manner inside the epitaxial reactor. Further, it was found that using a reduced pressure epitaxial reactor is preferred when forming layers of semiconductor material 220. Specifically, it is preferred that the epitaxial growth conditions are set to provide a mean free path roughly equal to or greater than the depth of trenches 122. It is also preferred that the aspect ratio of trenches 122 be in a range from about 1:1 to about 30:1 to provide good quality epitaxial layers.

It is further preferred that a selective epitaxial growth process is used to avoid growing epitaxial silicon overlying dielectric layer 46, which would produce polycrystalline silicon. Selectivity is controlled by adding HCl gas to the epitaxial growth chamber in an amount sufficient to suppress growth of silicon on the dielectric layers. Preferably, when using dichlorosilane or silane as the silicon source gas, the HCl flow rate is set to be in a range from greater than zero to about four to five times the flow rate of the silicon source gas. In an alternative embodiment, blanket layers are grown (i.e., the layers are grown overlying major surface 18 in addition to trenches 122), and planarization techniques are used to remove portions of the blanket layers that overlie major surface 18.

In the embodiment shown, an intrinsic layer 21 is formed first along the surfaces of trenches 122, and has a thickness of about 0.05 to about 0.1 microns. Intrinsic layer 21 preferably is undoped, and functions, among other things, to smooth out any irregularities on the sidewall and lower surfaces of trenches 122. N-type layer 23 is then formed overlying layer 21, with a phosphorous, arsenic or antimony dopant source being suitable. In one embodiment, n-type layer 23 is lightly doped and has a dopant concentration on the order of about $1.0\times10^{15}$ to about $1.0\times10^{17}$ atoms/cm$^3$. N-type layer 23 has a thickness typically less than about 1.0 microns, with a thickness of about 0.1 microns to about 0.4 microns being one preferred range.

Next, an intrinsic layer 24 is formed overlying n-type layer 23, and has thickness of about 0.1 to about 0.4 microns. Preferably, intrinsic layer 24 is undoped. A p-type layer 25 is then formed overlying second intrinsic layer 24, with boron being a suitable dopant source. By way of example, p-type layer 25 has a dopant concentration on the order of about $1.0\times10^{15}$ to about $1.0\times10^{17}$ atoms/cm$^3$. P-type layer 25 has a thickness typically less than about 1.0 microns, with a thickness of about 0.1 microns to about 0.3 microns being one preferred range. One purpose of intrinsic layer 24 is to improve conduction by reducing the mutual depletion of layers 23 and 25 at low drain voltage, which provides higher conduction efficiency.

Next, an intrinsic layer 27 is formed overlying p-type layer 25, and has a thickness of about 0.1 to about 1.0 microns. During subsequent heat treatments, n-type dopant in n-type layer 23 diffuses into intrinsic layers 21 and 24 to form n-type layer 221 as shown in FIGS. 7 and 10, and p-type layer 25 diffuses into intrinsic layers 24 and 27 to form p-type layer 222 as shown in FIGS. 7 and 10. The multiple layers shown in FIG. 11 are not shown in the other figures for ease of understanding. The dopant concentrations and thicknesses of n-type layers 221 and p-type layers 222 are configured to provide an appropriately balanced charge when device 100 is in operation. In a preferred embodiment, the center or central portion of trenches 122 is left open (i.e., that portion is not completely filled with a solid material). Additionally, in a preferred embodiment, after the formation of layers of semiconductor material 220, the epitaxial reactor is purged of HCl, source, and dopant gases, and device 100 is exposed to hydrogen at an elevated temperature. This smoothes out the topography of the outer surfaces of layers of semiconductor materials 220, which, among other things, enhances subsequent processing including the formation of plugs 91.

Figure 12:
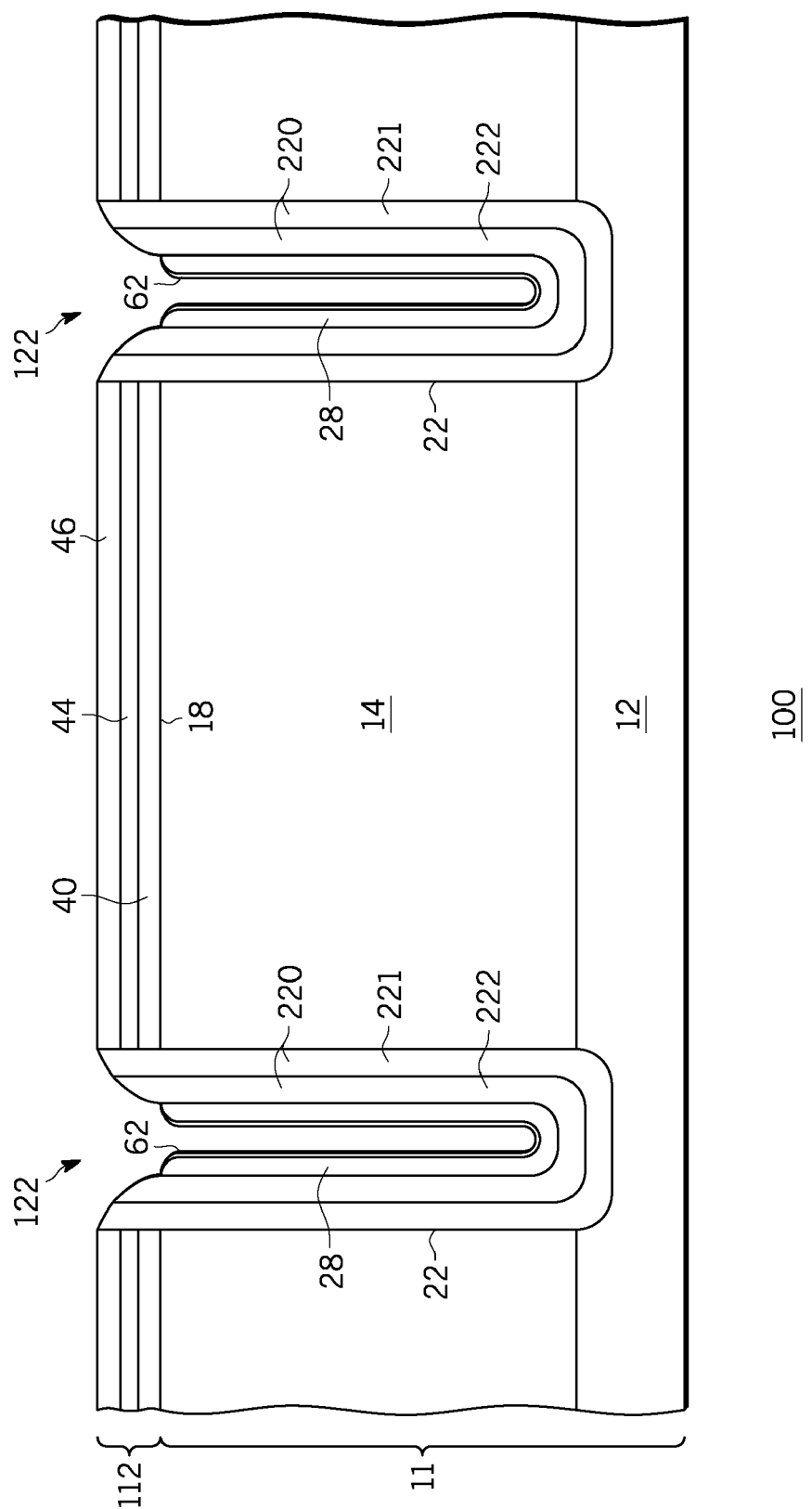

FIG. 12 shows an enlarged partial cross-sectional view of device 100 at a still further stage of fabrication. A first dielectric layer is formed overlying major surface 18 and layers of semiconductor material 220 in trenches 122. By way of example, this first dielectric layer comprises an oxide. In one embodiment, 0.02 microns of dry oxide are formed, followed by about 0.2 microns of deposited oxide. Next, a second dielectric layer is formed overlying the first dielectric layer. In one embodiment, the second dielectric layer comprises about 0.1 microns of silicon nitride. Conventional deposition techniques are used to form the first and second dielectric layers. Conventional dry etching techniques are then used to etch back the first and second dielectric layers leaving dielectric spacers, spacer layers, or dielectric layers 28 and 62 of each material within trenches 122 as shown in FIG. 12. In the example described, layer 28 comprises about 0.02 microns of dry oxide and about 0.2 microns of deposited oxide and layer 62 comprises about 0.1 microns of silicon nitride.

Figure 13:
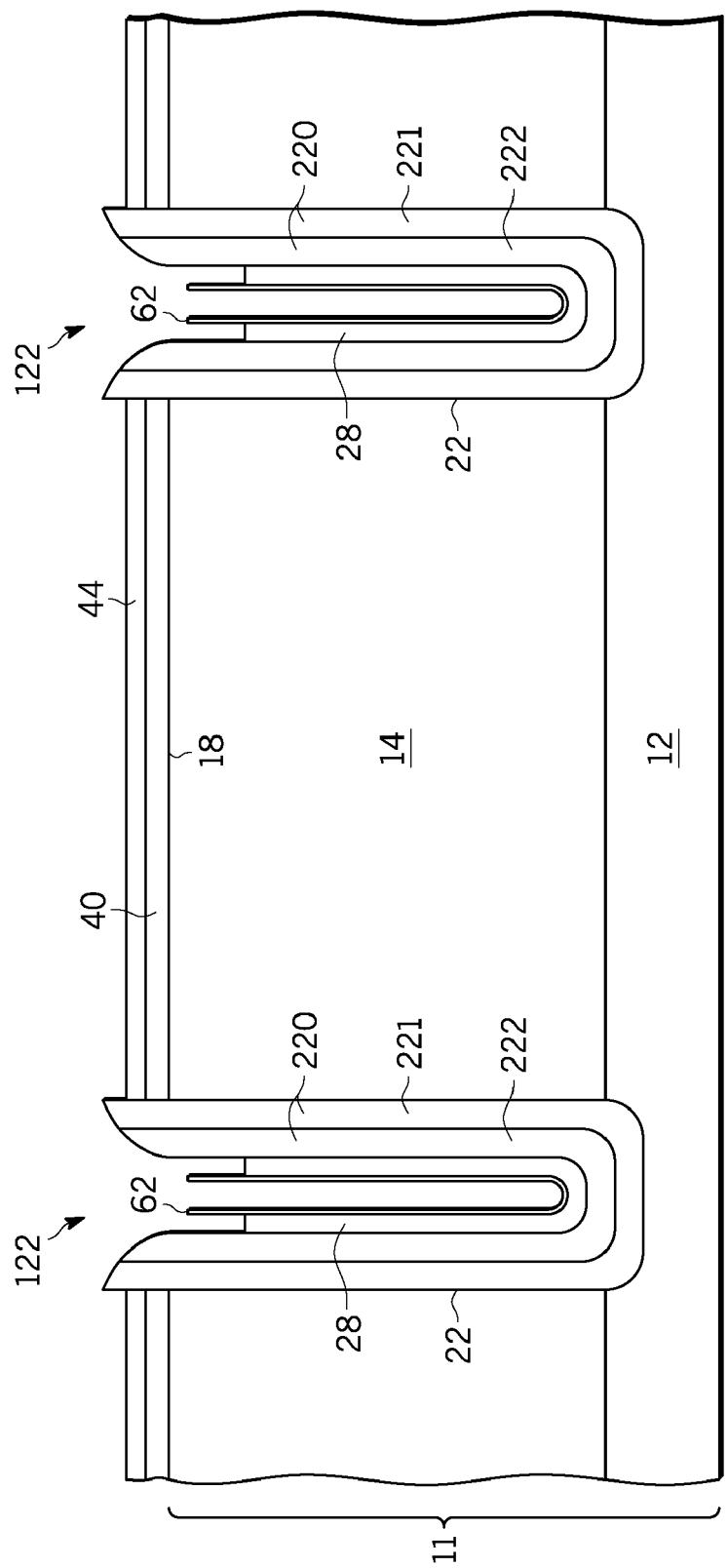
Figure 14:
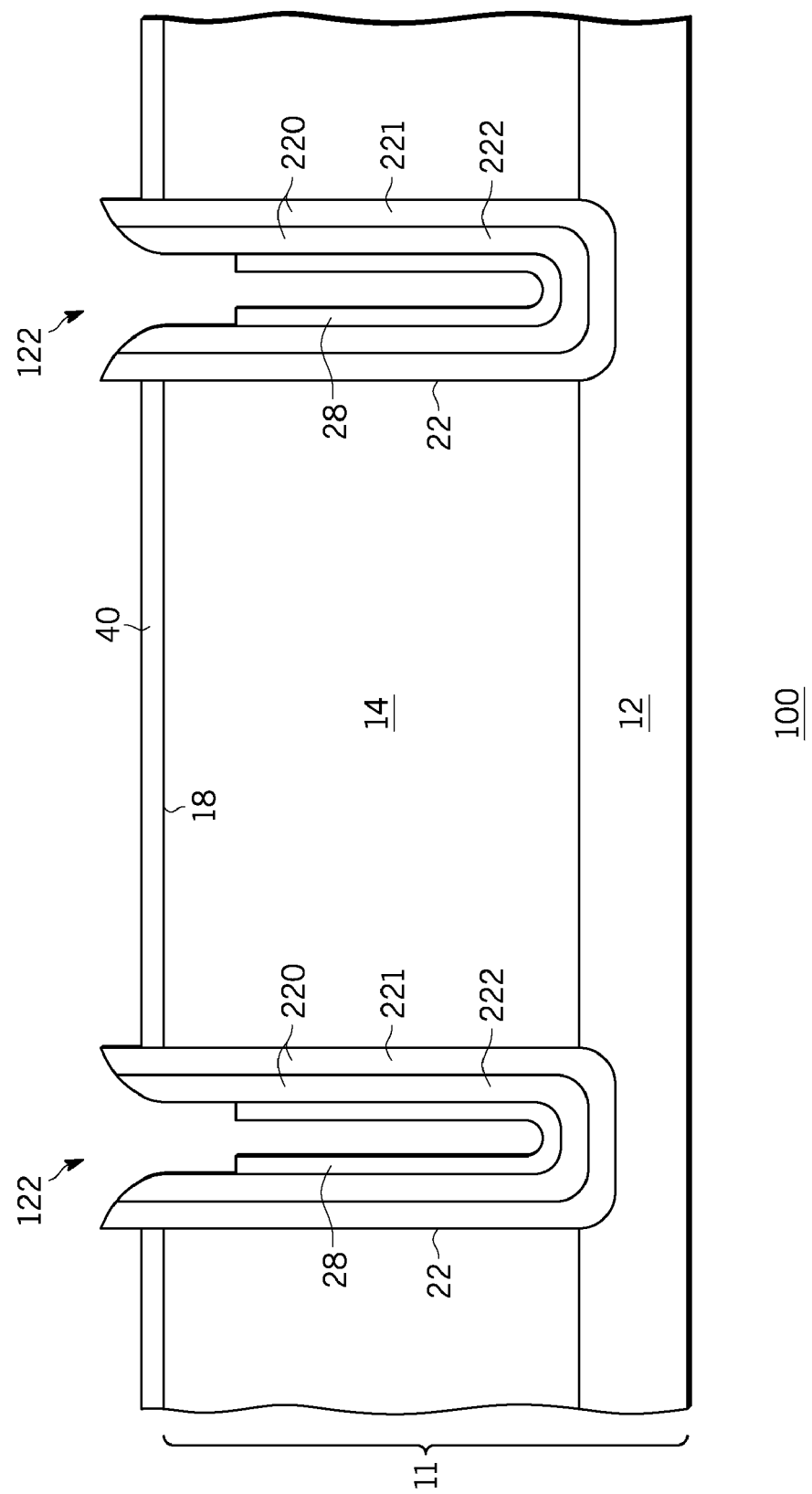

Next as shown in FIG. 13, which is an enlarged partial cross-sectional view of device 100 after further processing, dielectric layer 28 is exposed to an additional selective etching step to remove an upper portion of the dielectric material so that dielectric layer 28 is recessed from upper surfaces of dielectric layer 62. By way of example, when dielectric layer 28 comprises an oxide, a diluted HF wet etch (e.g., 10:1 for about 8-11 minutes) is used to recess dielectric layer 28 approximately 1.2 microns below dielectric layer 62. During these steps, dielectric layer 46 also may be removed. Dielectric layers 62 and 44 are then removed using conventional material removal techniques as shown in FIG. 14.

Figure 15:
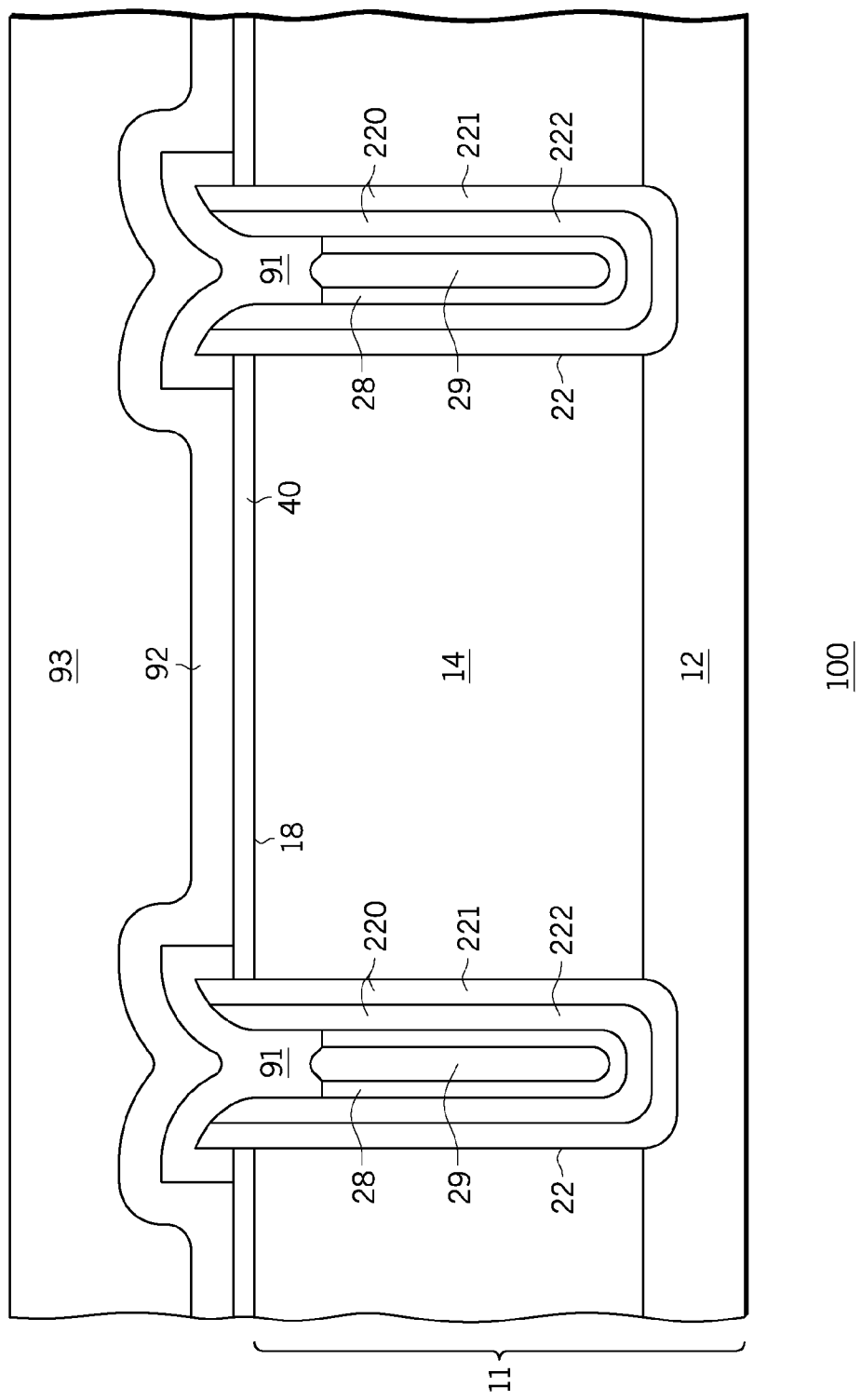

FIG. 15 shows an enlarged partial cross-sectional view of device 100 after additional processing. In accordance with a preferred embodiment, an epitaxial plug, single crystalline plug, plug of semiconductor material, or semiconductor plug region 91 is formed within the remaining openings of trenches 122 above dielectric layers 28 and along exposed portions of layers of semiconductor material 220. In accordance with this embodiment, plugs 91 comprise an epitaxial semiconductor material that has an opposite conductivity type to semiconductor layer 14. In the embodiment shown plugs 91 are p-type. In one embodiment, plugs 91 have a dopant concentration between about $1.0 \times 10^{17}$ atoms/cm$^3$ and about $1.0 \times 10^{19}$ atoms/cm$^3$. In an alternative embodiment, plugs 91 are undoped. Preferably, reduced pressure and selective epitaxial growth techniques are used to form plugs 91.

In one embodiment for forming plugs 91, a dichlorosilane source gas is used with hydrogen and HCl, which makes the growth selective to the upper portions of trenches 122 only. In alternative embodiments, silane, disilane, or trichlorosilane source gases are used. Depending on the growth temperature selected, reactor pressure is set within a range from approximately ten Torr to atmospheric. In one embodiment, a single wafer reactor is used with a reactor pressure of about 20 Torr. Suitable growth temperatures for dichlorosilane are in a range from about 950 degrees Celsius to about 1050 degrees Celsius. Suitable growth temperatures for silane or disilane are in range from about 575 degrees Celsius to about 700 degrees Celsius. Suitable growth temperatures for trichlorosilane are in a range from about 1050 degrees Celsius to about 1175 degrees Celsius. Caution is required with higher growth temperatures to avoid unwanted intermixing of dopants within the various epitaxial layers or doped regions of device 100. In one embodiment, plugs 91 have thicknesses in the range of about 0.10 microns to about 0.60 microns. By way of example, thickness is adjusted depending on the desired structure of plugs 91 (e.g., near-closure, complete closure, or overgrowth).

In one embodiment, a growth rate of about 0.30 microns per minute is used when selective epitaxial growth techniques and dichlorosilane are used. When non-selective epitaxial growth techniques and dichlorosilane are used, a growth rate in a range of about 1.0 micron to about 2.0 microns is used. Gas flow rates depend on reactor configuration, and are set by the growth conditions and structure required. In one embodiment, the following gas flows ranges were used in a selective growth process to form plugs 91 in a closed configuration using dichlorosilane: 30-40 standard liters per minute (slm) of hydrogen, 0.70-0.80 slm HCl, and 0.20-0.25 slm dichlorosilane.

In accordance with a preferred embodiment, plugs 91 are configured to seal off voids 29 in trenches 122, and are further configured to do so with minimal defects and negligible stress compared to structures that use dielectric/polysilicon or polysilicon fill techniques. By suppressing defects and stress, the reliability and quality of device 100 is improved. In one embodiment, sealed cores 29 are under a vacuum of less than about 20 Torr with some hydrogen present in sealed cores 29 from the epitaxial growth process.

After plugs 91 are formed, a polycrystalline semiconductor layer 92 is formed overlying major surface 18. By way of example, layer 92 comprises a polysilicon layer about 0.6 microns to about 0.9 microns thick and is formed using conventional deposition techniques. A planarizing photoresist layer 93 on the order of 1.0 to 2.0 microns is then formed overlying polycrystalline semiconductor layer 92.

Figure 16:
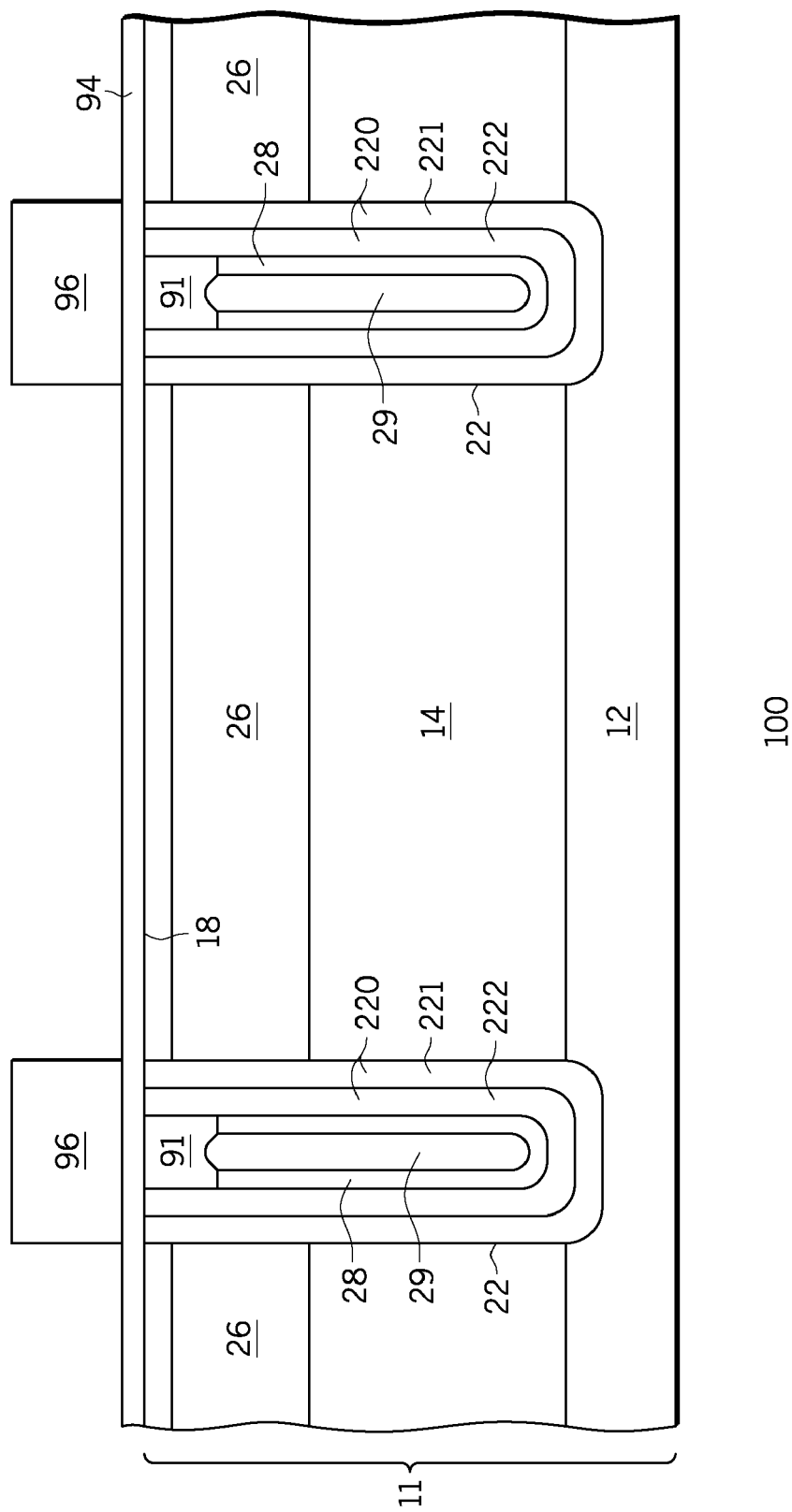

FIG. 16 is an enlarged partial cross-sectional view of device 100 after a planarizing or bulk removal process is used to remove layer 93, layer 92, and exposed or upper portions of plugs 91. By way of example, conventional etch back techniques are used for this removal step. In the alternative, chemical mechanical planarization techniques are used. Layer 40 (shown in FIG. 15) is then removed using, for example, a wet chemical etch. Next, a dielectric layer 94 is formed overlying major surface 18 and comprises, for example, an implant oxide having a thickness of about 0.05 microns to about 0.09 microns. A patterned photoresist layer 96 is then formed overlying major surface 18 in preparation for forming doped layers 26.

Dopant for doped layers 26 is then introduced or provided into semiconductor layer 14 below major surface 18 using patterned photoresist layer 96 as a mask. In one embodiment, high energy ion implantation is used to implant dopant for doped layers 26. By way of example, a MeV range implant of phosphorous is used, and an implant dose of about $1.0 \times 10^{12}$ atoms/cm$^2$ is sufficient. In this embodiment, the dopant concentration of layer 26 is greater than the dopant concentration of semiconductor layer 14 to provide a path having reduced resistance between channels 45 (shown in FIG. 1) and n-type layers 221. In one embodiment, the high energy implant places doped layer 26 below major surface 18 as shown in FIG. 16 so that doped layer 26 is sub-surface. Patterned photoresist layer 96 is then removed. The implanted dopant is then heat treated to diffuse the n-type dopant into semiconductor layer 14 to a selected depth. By way of example, doped layer 26 extends to a depth of about 2.0 microns to about 3.0 microns. In accordance with one embodiment, in the final structure doped layer 26 has a greater depth than body region 31 (shown in FIG. 17). In an alternative embodiment, a combined heat treatment step is used after dopant for body regions 31 is introduced as described below in FIG. 17. In an alternative embodiment, doped layers 26 are formed prior to the formation of trenches 122. By way of example, doped layers 26 are formed prior to the formation of hard mask 112 shown in FIG. 8.

Figure 17:
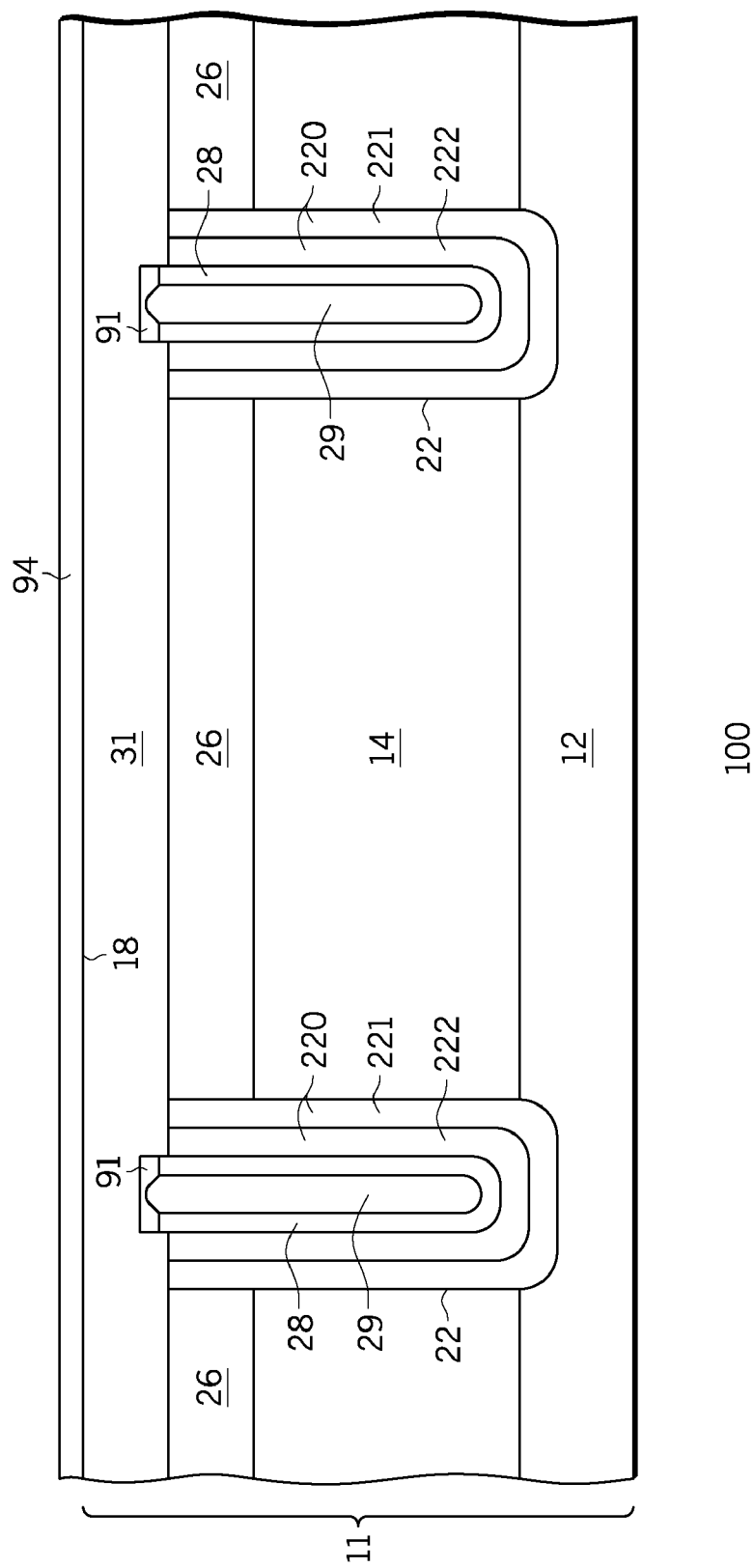

FIG. 17 shows an enlarged partial cross-sectional view of device 100 at a later step of fabrication. P-type dopant for body regions 31 is introduced or provided at major surface 18. In accordance with one embodiment, body regions 31 extend laterally to overlie all or portions of compensation trenches 22. That is, body regions 31 overlap at least p-type layers 222. By way of example, ion implantation is used with a boron implant dose of about $1.0 \times 10^{13}$ atoms/cm$^2$ and an implant energy of about 160 KeV. In an alternative embodiment, a series of boron implants are used to form body region 31, with a lighter dose/higher energy implant occurring first followed by gradually increasing doses and gradually decreasing energy implants occurring thereafter. In a further embodiment, this order is reversed. The implanted p-type dopant is heat treated to diffuse and/or activate the dopant to form regions 31. By way of example, body regions 31 have a depth of about 1.0 to about 2.0 microns.

Figure 18:
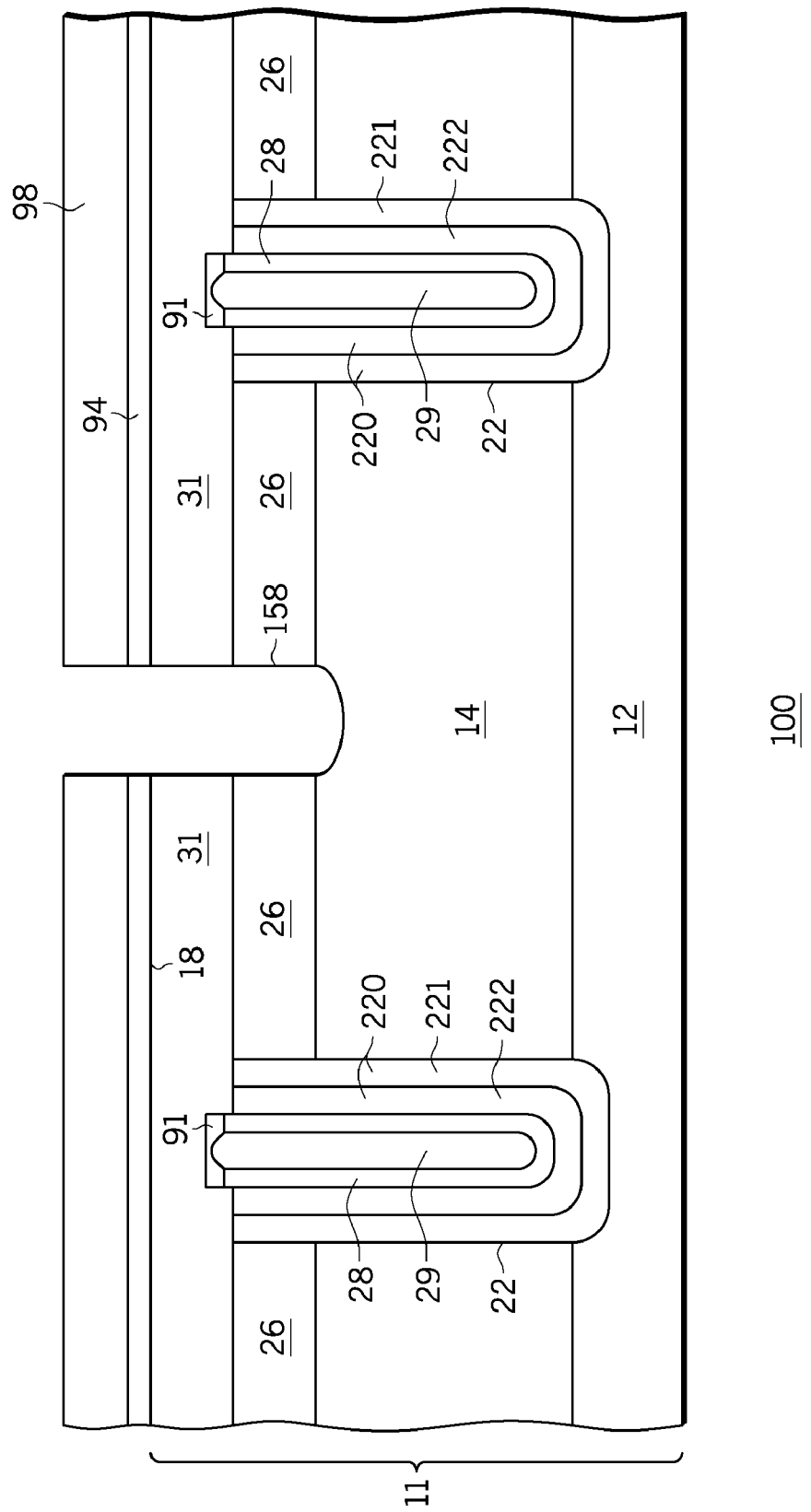

FIG. 18 is an enlarged partial cross-sectional view of device 100 after completing preliminary steps in the formation of a control or gate trench 158. In an early step, a dielectric layer 98 is formed overlying dielectric layer 94. By way of example, dielectric layer 98 comprises a silicon nitride layer about 0.1 microns to about 0.2 microns thick and is formed using conventional techniques. Next a layer of photoresist (not shown) is deposited overlying dielectric layer 98 and an opening is formed for control trench 158. Portions of layers 98 and 94 are then removed to expose a portion of major surface 18. The photoresist layer is then removed. Next, control trench 158 is formed extending from major surface 18 generally centrally located between adjacent charge-compensated trenches 22. By way of example, a conventional anisotropic dry etch is used to form control trench 158. By way of example, control trench 158 has a width of about 0.4 microns to about 0.7 microns and has a depth greater than the depth of body regions 31. In a preferred embodiment, control trench 158 has a depth greater than doped regions 26. In one embodiment, control trench 158 has a depth of about 1.0 microns to about 1.6 microns.

Figure 19:
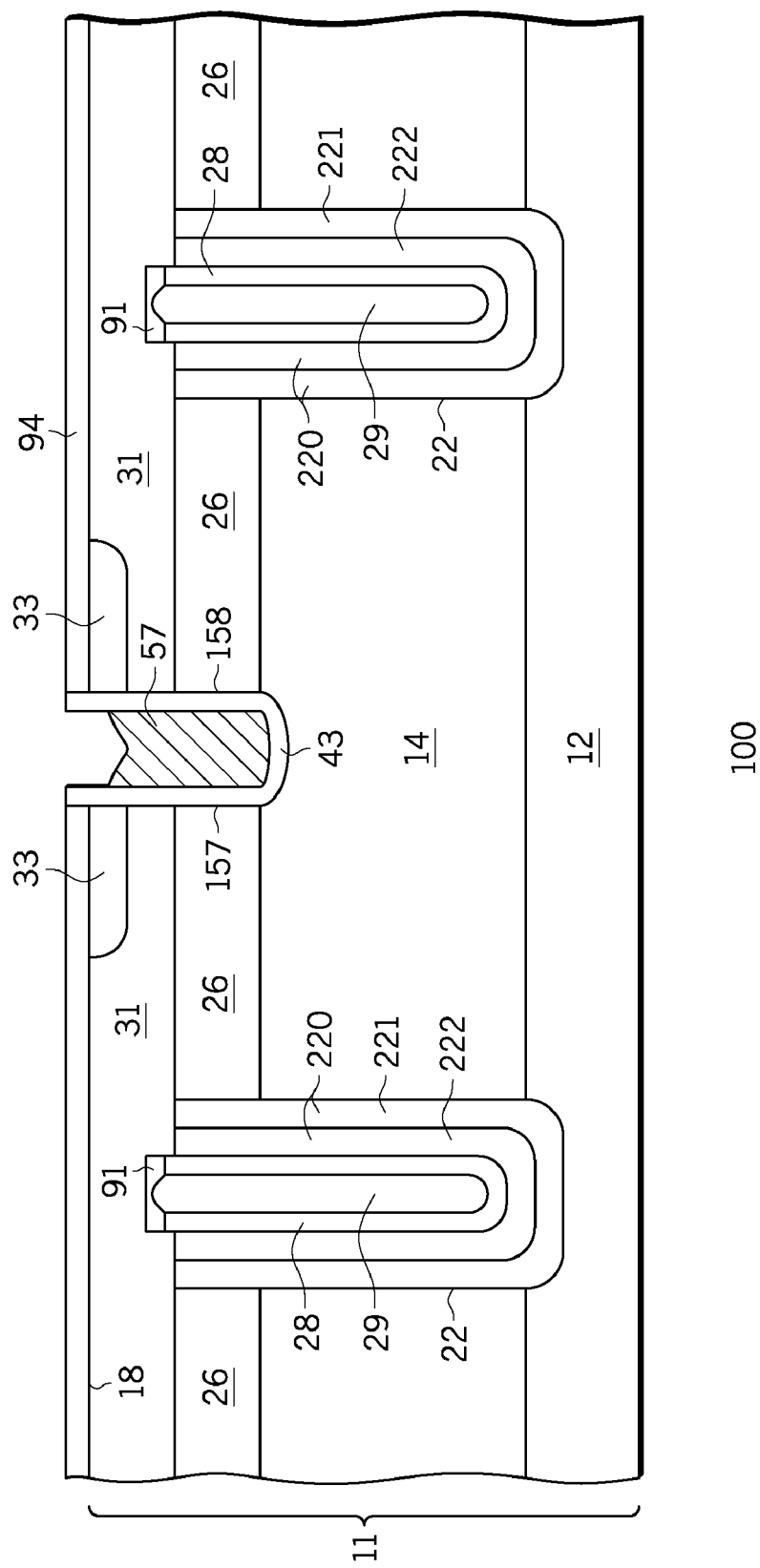

FIG. 19 is an enlarged partial cross-sectional view of device 100 after further processing. In one embodiment, a thin thermal oxide is grown overlying the exposed surfaces of control trench 158. This oxide is then removed. Dielectric layer 98 also is removed. Next, gate dielectric layer 43 is formed overlying surfaces of control trench 158. In one embodiment, gate dielectric layer 43 comprises silicon oxide and has a thickness of about 0.05 microns to about 0.1 microns. In another embodiment, gate dielectric layer 43 is thicker along the bottom portion and lower sidewall portions of control trench 158. A conductive layer such as a doped or undoped polysilicon layer is then deposited overlying gate dielectric layer 43 and partially removed to form gate conductive region 57. For example, gate conductive regions 57 comprise about 0.2 microns of doped or undoped polysilicon. If gate conductive region 57 is initially undoped, this region is subsequently doped during the formation of source regions 33. In one embodiment, gate conductive region 57 is recessed below major surface 18. Together, control trench 158, gate dielectric layer 43 and gate conductive region 57 form control structure 157. In an alternative embodiment, control structure 157 is formed prior to the formation of charge-compensated trenches 22. This alternative approach is used when the impact of the thermal budget on the dopant profiles of layers 221 and 222 is a concern. The configuration of doped regions 26 is conveniently flexible enough to support either process sequence.

Next, a photoresist layer (not shown) is deposited and patterned to provide openings for the formation of source regions 33 adjacent to control structure 157. Source regions 33 are then formed using, for example, a phosphorous or arsenic ion implant and anneal step. By way of example, an arsenic implant is used with a dose $1.0 \times 10^{15}$ atoms/cm$^2$ to about $5.0 \times 10^{15}$ atoms/cm$^2$ being sufficient. This dopant is activated using, for example, a rapid anneal of 45 seconds at 1030 degrees Celsius. In this embodiment, source regions 33 are formed on both sides of control structure 157.

Figure 20:
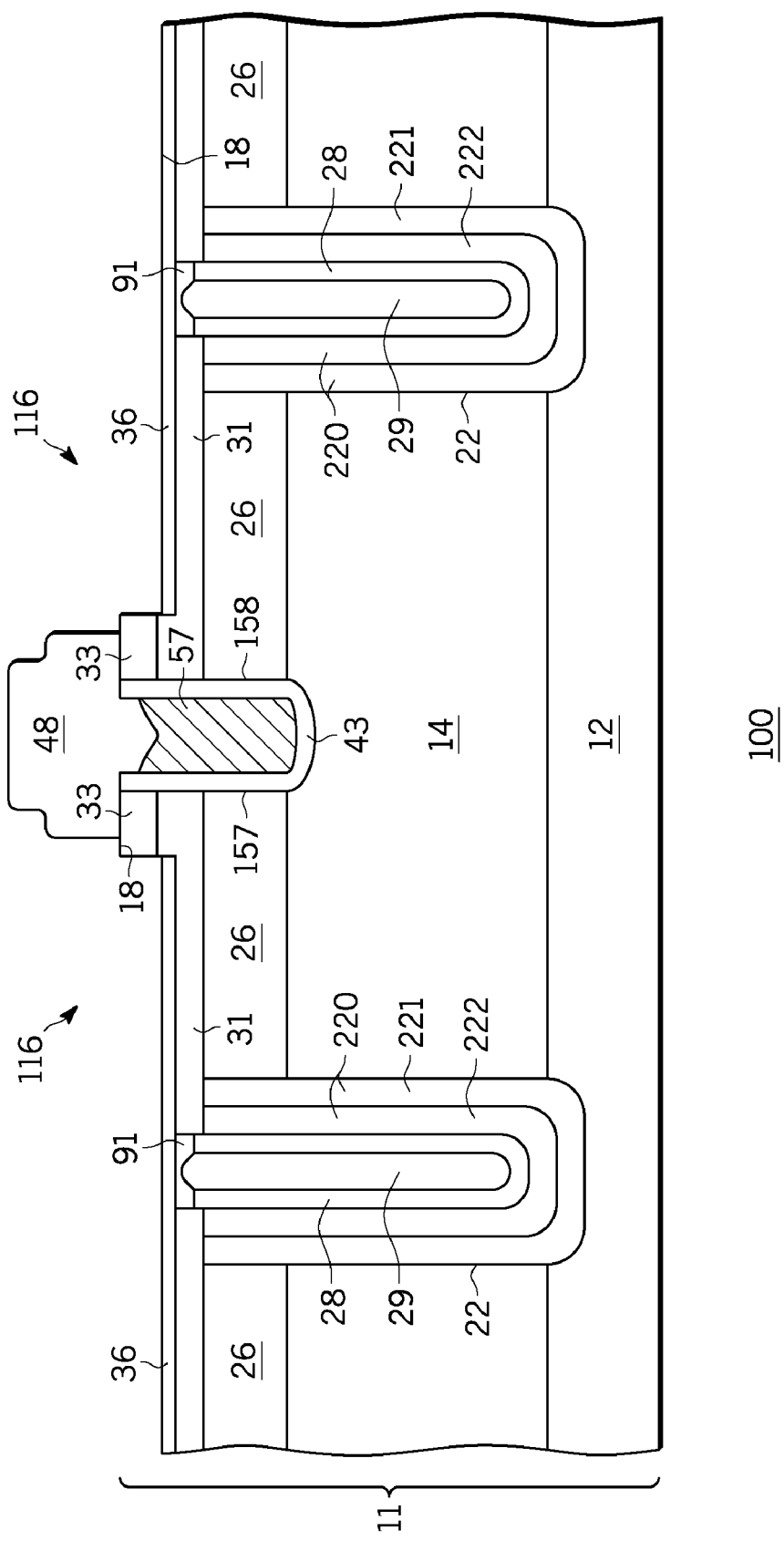

Next, interlayer dielectric region 48 is formed overlying major surface 18. By way of example, interlayer dielectric 48 comprises a deposited oxide and has a thickness on the order of about 1.0 micron. A conventional contact photoresist and etch process is then used to form contact openings 116 overlying and exposing portions of major surface 18 as shown in FIG. 20. In a preferred embodiment, an anisotropic etch is then used to remove a portion of semiconductor layer 14 adjacent source regions 33 and above body regions 31 and compensation trenches 22. By way of example, enough material is removed from semiconductor layer 14 to extend to about the depth of source regions 33 or deeper. An additional dopant is then added to portions of major surface 18 above body regions 31 and compensation trenches 22 to form body contact regions 36. By way of example, a boron ion implant is used with an implant dose on the order of $1.0 \times 10^{15}$ atoms/cm$^2$ to about $5.0 \times 10^{15}$ atoms/cm$^2$ being sufficient. The implanted dopant is then activated using, for example, a rapid anneal process. Portions of interlayer dielectric layer 48 are then removed along the sides to expose upper surface portions of source regions 33 (shown in FIG. 7). Source contact layer 63 is then formed overlying major surface 18 and makes contact to both source regions 33 and body regions 36 as shown in FIG. 7. In one embodiment, source contact layer 63 comprises a titanium/titanium nitride barrier layer and an aluminum silicon alloy formed overlying the barrier layer, or the like. Drain contact layer 13 is formed overlying an opposing surface of semiconductor material 11 as shown in FIG. 7, and comprises, for example, a solderable metal structure such as titanium-nickel-silver, chrome-nickel-gold, or the like. In an alternative embodiment, layer 13 comprises a conductive epoxy or the like.

In summary, a semiconductor device having a trench structure with a single crystal sealing plug has been described including a method of manufacture. The sealing plug provides, among other things, a reduced stress sealing configuration that also reduces the incorporation of contaminates in the core region of the trench. This provides a more reliable device. In addition, the trench structure reduces the impacts of parasitic devices in proximity to the trench. The trench structure described is suitable for many applications including but not limited to trench isolation structures and super junction structures.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device comprising:
   a region of semiconductor material having a major surface;
   a trench extending from the major surface into the region of semiconductor material, wherein the trench has upper sidewall surfaces, lower sidewall surfaces, and a lower surface;
   a dielectric layer overlying the lower sidewall surfaces and the lower surface of the trench; and
   a single crystal semiconductor plug extending from the upper sidewall surfaces of the trench, wherein the single crystal semiconductor plug at least partially seals the trench, and wherein the single crystal semiconductor plug does not overlie major surfaces of the dielectric layer.

2. The device of claim 1, wherein the single crystal semiconductor plug completely seals the trench to provide a sealed core.

3. The device of claim 2, wherein the sealed core is under vacuum.

4. The device of claim 1, wherein the trench is configured as an isolation trench structure.

5. The device of claim 1 further comprising at least two single crystal semiconductor layers formed overlying surfaces of the trench, wherein the at least two single crystal semiconductor layers are interposed between surfaces of the trench and the dielectric layer, and wherein the single crystal semiconductor plug extends from surfaces of an outermost single crystal semiconductor layer.

6. The device of claim 5, wherein the at least two single crystal semiconductor layers have opposite conductivity types to provide a vertical charge compensation structure.

7. The device of claim 6, wherein the region of semiconductor material and an innermost single crystal semiconductor layer comprise a first conductivity type, and wherein the outermost single crystal semiconductor layer comprises a second conductivity type opposite the first conductivity type, and wherein the device further comprises:
 a body region of the second conductivity type formed in the region of semiconductor material adjacent the vertical charge compensation structure;
 a source region of the first conductivity type formed in the body region; and
 a control structure formed adjacent the source and body regions, wherein the source region is interposed between the control structure and the vertical charge compensation structure.

8. The device of claim 6, wherein the single crystal semiconductor plug comprises the second conductivity type.

9. The device of claim 1 further comprising a passive component formed overlying the single crystal semiconductor plug.

10. The device of claim 9, wherein the passive component comprises one of a capacitor, an inductor, or an input/output pad.

11. The device of claim 1 further comprising an isolation region formed in the region of semiconductor material adjacent the single crystal semiconductor plug.

12. A semiconductor device comprising:
 a semiconductor region having a major surface;
 a trench formed in the semiconductor region extending from the major surface;
 a vertical charge compensation structure formed overlying surfaces of the trench, wherein the vertical charge compensation structure includes a first semiconductor layer of a first conductivity type adjoining the semiconductor region, and a second semiconductor layer of a second conductivity type opposite to the first conductivity type adjoining the conduction layer;
 a dielectric layer formed overlying lower sidewall surfaces and the lower surface of the second semiconductor layer while leaving upper sidewall portions of the second semiconductor layer exposed;
 a single crystal semiconductor plug formed at an upper portion of the trench and extending from the upper sidewall portions of the second semiconductor layer;
 a control structure formed in the semiconductor region laterally spaced apart from the vertical charge compensation structure;
 a body region adjoining and between the control structure and the vertical charge compensation structure, wherein the body region has the second conductivity type; and
 a source region overlying a portion of the body region and adjoining the control structure.

13. The device of claim 12 further comprising a conductive layer overlying the major surface and electrically coupled to the source region, the body region and the second semiconductor layer.

14. The device of claim 12, wherein the single crystal semiconductor plug has an upper surface that is in proximity to the major surface.

15. The device of claim 12, wherein the single crystal semiconductor plug completely seals the trench to provide a sealed core.

16. The device of claim 12, wherein the single crystal semiconductor plug comprises the second conductivity type.

17. A semiconductor device comprising:
 a semiconductor substrate including a well region formed in spaced relationship therewith, the well region including a major surface;
 a trench extending from the major surface, the trench having upper sidewall surfaces, lower sidewall surfaces, and a lower surface;
 a dielectric layer overlying the lower sidewall surfaces and the lower surface of the trench; and
 a plug extending from the upper sidewall surfaces of the trench, the plug comprising a single crystalline semiconductor material and not overlying major surfaces of the dielectric layer.

18. The device of claim 17 further comprising a charge-compensated structure formed adjoining the trench.

19. The device of claim 18 further comprising:
 a body region of the second conductivity type formed in the well region of semiconductor material adjacent the charge-compensated structure;
 a source region of the first conductivity type formed in the body region; and
 a control structure formed adjacent the source and body regions.

20. The device of claim 17, the plug forming a sealed core that is under vacuum.

* * * * *